(12) United States Patent
Sahoo et al.

(10) Patent No.: US 11,552,578 B1
(45) Date of Patent: Jan. 10, 2023

(54) SYMMETRIC HYBRID CONVERTERS

(71) Applicants: Ashish K. Sahoo, San Jose, CA (US); Brandon Pierquet, San Francisco, CA (US)

(72) Inventors: Ashish K. Sahoo, San Jose, CA (US); Brandon Pierquet, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/548,871

(22) Filed: Dec. 13, 2021

Related U.S. Application Data

(63) Continuation of application No. 16/547,822, filed on Aug. 22, 2019, now Pat. No. 11,201,561, which is a (Continued)

(51) Int. Cl.
*H02M 7/219* (2006.01)
*H02M 1/42* (2007.01)
(Continued)

(52) U.S. Cl.
CPC ......... *H02M 7/219* (2013.01); *H02M 1/4233* (2013.01); *H02M 7/49* (2013.01);
(Continued)

(58) Field of Classification Search
CPC ...... H02M 7/219; H02M 1/4233; H02M 7/49; H02M 7/4835; H02M 7/2195; H03D 7/125
See application file for complete search history.

(56) References Cited

U.S. PATENT DOCUMENTS 7,480,156 B1   1/2009   Wittenbreder, Jr.
9,450,506 B2   9/2016   Perreault et al.
(Continued)

OTHER PUBLICATIONS

Lin, Bor-Ren, "Hybrid DC/DC converter based on dual three-level circuit and half-bridge circuit", https://www.researchgate.net/publication/287806932_Hybrid_DCDC_converter_based_on_dual_three-level_circuit_and_half-bridge_circuit, Dec. 2016 (Downloaded Nov. 27, 2017), 2 pp.
(Continued)

*Primary Examiner* — Kyle J Moody
(74) *Attorney, Agent, or Firm* — Young Basile Hanlon & MacFarlane, P.C.

(57) ABSTRACT

Systems and methods for power conversion are described. Symmetric topologies and modulation schemes are described that may reduce common-mode noise. For example, a system may include a transformer including a first secondary winding and a second secondary winding; a rectifier, including a set of switches, that connects taps of the first secondary winding and the second secondary winding to a first terminal and a second terminal, wherein the rectifier is symmetric with respect to the first secondary winding and the second secondary winding; a battery connected between the first terminal and the second terminal; and a processing apparatus that is configured to control the set of switches to rectify a multilevel voltage signal on the transformer, including: selecting a modulation scheme from among two or more modulation schemes based on a measured voltage level of the battery.

20 Claims, 11 Drawing Sheets

Related U.S. Application Data continuation of application No. 16/283,935, filed on Feb. 25, 2019, now Pat. No. 10,536,092.

(60) Provisional application No. 62/637,633, filed on Mar. 2, 2018.

(51) Int. Cl.
*H03D 7/12* (2006.01)
*H02M 7/49* (2007.01)
*H02M 7/483* (2007.01)

(52) U.S. Cl.
CPC .......... *H03D 7/125* (2013.01); *H02M 7/2195* (2021.05); *H02M 7/4835* (2021.05)

(56) References Cited

U.S. PATENT DOCUMENTS

| | | | | |
|---|---|---|---|---|
| 10,069,430 | B2 * | 9/2018 | Sahoo | H02M 7/4807 |
| 10,536,092 | B1 * | 1/2020 | Sahoo | H02M 7/219 |
| 2001/0001535 | A1 | 5/2001 | Johnson et al. | |
| 2005/0047175 | A1 | 3/2005 | Kawasaki et al. | |
| 2006/0152085 | A1 | 7/2006 | Flett et al. | |
| 2010/0001523 | A1 | 1/2010 | Sato et al. | |
| 2014/0119060 | A1 | 5/2014 | Zhu et al. | |
| 2016/0109493 | A1 * | 4/2016 | Cheng | H02J 3/1857 324/76.12 |
| 2019/0143822 | A1 | 5/2019 | Malek et al. | |
| 2019/0181742 | A1 | 6/2019 | Chen | |

OTHER PUBLICATIONS

Ruan, X., et al., Fundamental Considerations of Three-Level DC-DC Converters: Topologies, Analyses, and Control, IEEE Transactions on Circuits and Systems-I: Regular Papers, vol. 55, No. 11, Dec. 2008 (11 pp).

Suresh, Y., et al., "Investigation on cascade multilevel inverter with symmetric, asymmetric, hybrid and multi-cell configurations", Ain Shams Engineering Journal (2017) 8, 263-276, Available online Oct. 27, 2016 (14 pp).

Vincotech, "Vincotech Power Modules Catalog 2011/12", Downloaded Feb. 8, 2019 from https://www.arrow.com, (48 pp).

Abramson, Rose A., et al., "Design and Evaluation of a Reconfigurable Stacked Active Bridge dc/dc Converter for Efficient Wide Load-Range Operation", IEEE, Jul. 2017, 978-1-5090-5366 (11 pp).

Bodor, M., et al., "Soft Switching DC-DC Converter with Controlled Output Rectifier", 10th Scientific Conference of Young Researchers—FEl TU of Kosice, 2010, (4 pp).

Guo, Z., et al., "Hybrid Three-Level and Half-Bridge DC-DC Converter With Reduced Circulating Loss and Output Filter Inductance", IEEE Transactions on Power Electronics (vol. 30, Issue 12, Dec. 2015), Downloaded Nov. 27, 2017, https://ieeexplore.ieee.org/document/7017562, (4 pp).

* cited by examiner

SYMMETRIC HYBRID CONVERTERS

CROSS-REFERENCE TO RELATED APPLICATION(S)

This application is a continuation of U.S. patent application Ser. No. 16/547,822, which was filed on Aug. 22, 2019, which is a continuation of U.S. patent application Ser. No. 16/283,935, which was filed on Feb. 25, 2019, which claims the benefit of U.S. Provisional Application No. 62/637,633, filed on Mar. 2, 2018. The content of the foregoing applications is incorporated herein by reference in its entirety for all purposes.

TECHNICAL FIELD

This disclosure relates to symmetric hybrid converters.

BACKGROUND

Multilevel power converters are used to transfer power between circuits operating at different voltage levels. For example, multilevel power converters may be employed at terminals of high voltage power transmission lines. For example, multilevel power converters may be employed in power supplies for computing server racks.

SUMMARY

Disclosed herein are implementations of symmetric hybrid converters.

In a first aspect, the subject matter described in this specification can be embodied in systems that include a transformer including a first secondary winding and a second secondary winding; a rectifier, including a set of switches, that connects taps of the first secondary winding and the second secondary winding to a first terminal and a second terminal, wherein the rectifier is symmetric with respect to the first secondary winding and the second secondary winding; a battery connected between the first terminal and the second terminal; and a processing apparatus that is configured to control the set of switches to rectify a multilevel voltage signal on the transformer, including: selecting a modulation scheme from among two or more modulation schemes based on a measured voltage level of the battery.

In a second aspect, the subject matter described in this specification can be embodied in systems that include a transformer including a first secondary winding, connecting a first tap and a second tap, and a second secondary winding, connecting a third tap and the second tap; a first capacitor connecting the first tap to a first node; a second capacitor connecting the third tap to a second node; a first switch connecting the first node to a first terminal; a second switch connecting the first node to the second node; a third switch connecting the second node to a second terminal; a fourth switch connecting the second tap to the first terminal; a fifth switch connecting the second tap to the second terminal; and an electrical load connected between the first terminal and the second terminal.

In a third aspect, the subject matter described in this specification can be embodied in systems that include a transformer including a first secondary winding, connecting a first tap and a second tap, and a second secondary winding, connecting a third tap and a fourth tap; a first switch connecting the first tap to a first terminal; a second switch connecting the first tap to the fourth tap; a third switch connecting the fourth tap to a second terminal; a fourth switch connecting the second tap to the first terminal; a fifth switch connecting the second tap to the third tap; a sixth switch connecting the third tap to the second terminal; and an electrical load connected between the first terminal and the second terminal.

In a fourth aspect, the subject matter described in this specification can be embodied in systems that include a transformer including a secondary winding connecting a first tap and a second tap; a first capacitor connecting the first tap to a first node; a second capacitor connecting the second tap to a second node; a first switch connecting the first node to a first terminal; a second switch connecting the first node to the second node; a third switch connecting the second node to a second terminal; and an electrical load connected between the first terminal and the second terminal.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1A:
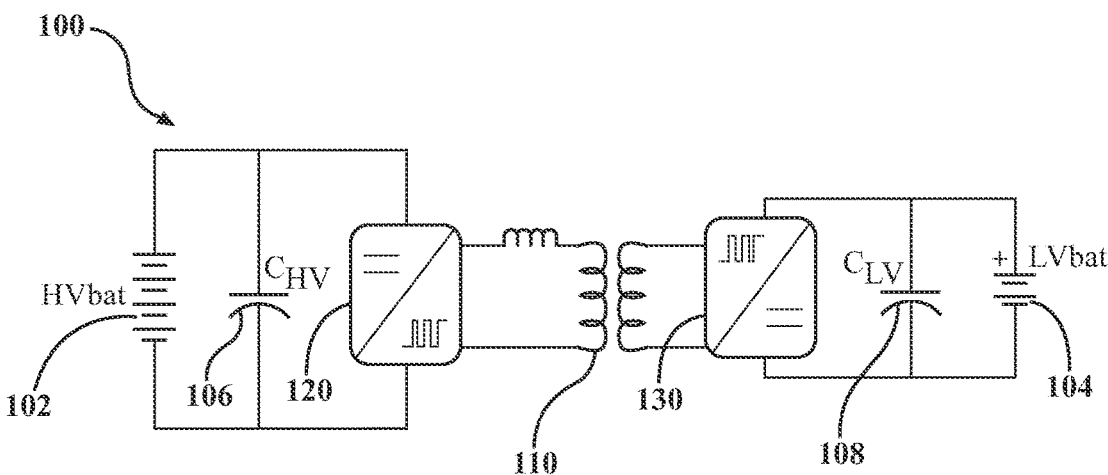
FIG. 1A is a circuit diagram of an example of a system including a high voltage to low voltage DC/DC converter.

Described herein are systems, circuits, and methods that may be used to implement symmetric hybrid converters. Efficiency, size, weight, power density, and reliability can be important design considerations in power converters. Power converter circuit topologies and modulation schemes are described that may increase efficiency, reduce size and weight, increase power density, and/or increase reliability compared to conventional topologies and modulation schemes. For example, these power converters may be implemented in power distribution networks, photovoltaic systems, wind turbines, electric vehicles, or computing server racks.

For example, a topology of switches in an inverter connecting secondary windings of a transformer to an electrical load may be symmetric with respect to the secondary windings of the transformer. The symmetry of the topology may enable switches to be opened and closed in modulation states that are symmetric and generate zero or small common mode noise. In some implementations, the symmetry of the topology may enable switches to be opened and closed in one or more pairs of modulation states that are individually asymmetric with respect to the secondary windings of the transformer, which may result in transient common mode noise, but a pair of asymmetric modulation states are symmetric with respect to each other and generate zero or small net common mode noise when the pair of states are balanced in a cadence of a modulation scheme. Using a converter topology and/or modulation scheme that is symmetric with respect to the secondary windings of the transformer may reduce common mode noise, which may allow for an elimination or reduction in filtering used to prevent electromagnetic interference emanating from the magnetic components of the converter. Reducing the amount of electromagnetic interference filtering may allow a power converter to be constructed for less expense and/or with smaller size than in a converter with high common mode noise and resulting electromagnetic interference.

In switched multilevel converters, multiple modulation states may be used for a given transformer voltage level. The multiple states for a voltage level may utilize (e.g., conduct current through) different components (e.g., switches), and alternating between the multiple states during operation of the converter may serve to balance the usage of these components. Balancing the usage of components may reduce thermal stress on components and increase reliability of a power converter. Circuit topologies and modulation schemes for efficiently implementing this strategy are described below.

Different modulations schemes can be used for a power converter depending on a present voltage level of a battery being charged using the power converter. When the battery voltage is high, a modulation scheme that splits current and/or voltage between multiple secondary windings of a transformer. When the battery voltage is low, a modulation scheme that concentrates current and/or voltage in a single secondary winding of a transformer at times, while balancing the usage of the secondary windings of the transformer over multiple states in the modulation scheme.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

FIG. 1A is a circuit diagram of an example of a system 100 including a high voltage to low voltage DC/DC converter. The system 100 couples power from a high voltage battery 102 (e.g., a 400 Volt or an 800 volt battery) to a low voltage battery 104 (e.g., a 12 volt or a 48 volt battery). A capacitor 106 is in parallel with the high voltage battery 102 and a capacitor 108 is in parallel with the low voltage battery 104. The system 100 includes a transformer 110 that couples power from an inverter 120 to a rectifier 130. For example, transformer 110 may be implemented using the transformer 300 of FIG. 3A. For example, transformer 110 may be implemented using the transformer 350 of FIG. 3B. The high voltage battery 102 is connected to terminals of the inverter 120 and the low voltage battery 104 is connected to terminals of the rectifier 130.

For example, a computing server rack may use the system 100 to couple bulk power at a low DC voltage (e.g., from a battery back-up system) to individual equipment items. For example, electric vehicles may use the system 100 to couple power from a high voltage battery 102, which provides power to a propulsion system to move the vehicle, to a low voltage battery 104, which provides power to one or more auxiliary systems of the electric vehicle. For example, the propulsion system may include a DC motor, a drive train, and/or a transmission system configured to convert electrical power to mechanical power and transfer the mechanical power to torque on wheels of the vehicle. Some applications utilize a high battery voltage (e.g., a 400 volt battery or an 800 volt battery) and different low voltage battery voltages (e.g., 12V and 48V) and may also support very wide input range and output range. On the low voltage side, to increase the power rating of the converter, many devices may be connected in parallel, which may restrict the practical power output of the converter.

The rectifier 130 may be suitable to be interfaced with the low voltage battery 104 and be able to provide high efficiency while meeting desired specifications. For example, rectifier 130 may be implemented using the topology of the system 200 of FIG. 2. For example, rectifier 130 may be implemented using the topology of the system 400 of FIG. 4. For example, rectifier 130 may be implemented using the topology of the system 700 of FIG. 7. Switching control may be formulated for operation of a topology of the inverter 120 and the rectifier 130 to attain zero voltage switching over an entire battery range. For example, the processing apparatus 1010 of the system 1000 of FIG. 10 may be used to implement switching control for the system 100. Zero voltage switching enables use of switching frequency in the MHz range and may reduce the size of magnetic components. This may result in obtaining high power density which converts to savings in volume and weight of the system 100.

For high voltage batteries (e.g., an 800 volt battery), newer multilevel topologies may be used to exploit the benefits of latest wide band-gap GaN technology (e.g., available to 650 volts). The inverter 120 may be suitable to be interfaced with the high voltage battery 102 and be able to provide high efficiency while meeting desired specifications. In some implementations, switching control may be formulated to achieve active voltage balancing of split capacitors in the inverter 120. For example, the inverter 120 may include a three-level stacked half-bridge topology. The topology of the inverter 120 may achieve higher efficiency than conventional half-bridge topologies.

The converters of the system 100 may be bidirectional in the sense that power may be transferred from the high voltage battery 102 to the low voltage battery 104 and/or from the low voltage battery 104 to the high voltage battery 102.

Figure 1B:
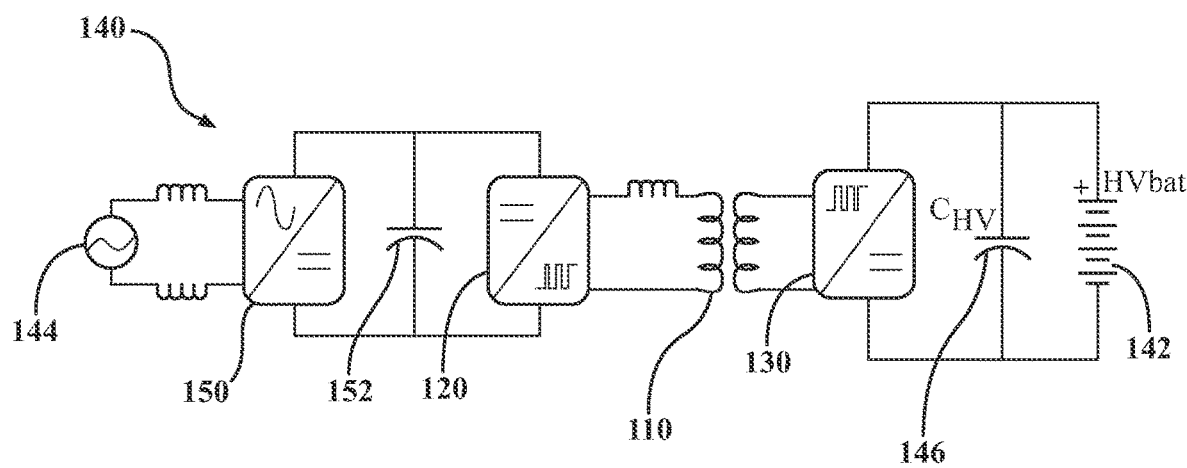
FIG. 1B is a circuit diagram of an example of a system including a multi-stage, high voltage charger.
Figure 1C:
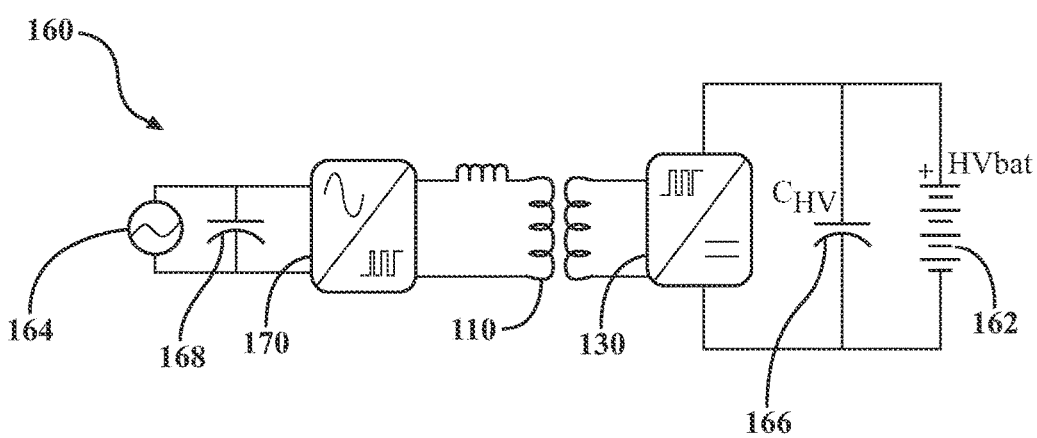
FIG. 1C is a circuit diagram of an example of a system including a single-stage, high voltage charger.

The inverter 120 and/or the rectifier 130 topologies can be employed in other systems for different applications, such as the system 140 of FIG. 1B and the system 160 of FIG. 1C. The inverter 120 and the rectifier 130 may be bidirectional, and hence can be used in applications of high voltage to low voltage DC/DC converters, and high voltage chargers.

FIG. 1B is a circuit diagram of an example of a system 140 including a multi-stage, high voltage charger. The system 140 includes a high voltage battery 142 that is charged from an alternating current (AC) power source 144 (e.g., from a grid). A capacitor 146 is in parallel with the high voltage battery 142. Power from the AC power source 144 is converted to DC voltage using the rectifier 150. Power from the resulting DC voltage across a capacitor 152 may then be the further converted to a DC voltage level used to charge the high voltage battery 142 by a DC/DC converter including the inverter 120, the transformer 110, and the rectifier 130.

FIG. 1C is a circuit diagram of an example of a system 160 including a single-stage, high voltage charger. The system 160 includes a high voltage battery 162 that is charged from an alternating current (AC) power source 164 (e.g., from a grid). A capacitor 166 is in parallel with the high voltage battery 142 and a capacitor 168 is in parallel with the AC power source 164. Power from the AC power source 144 is converted to a DC voltage level used to charge the high voltage battery 162 by an AC/DC converter including an AC/AC converter 170 that couples a high frequency multi-level signal through the transformer 110 to the rectifier 130.

Figure 2:
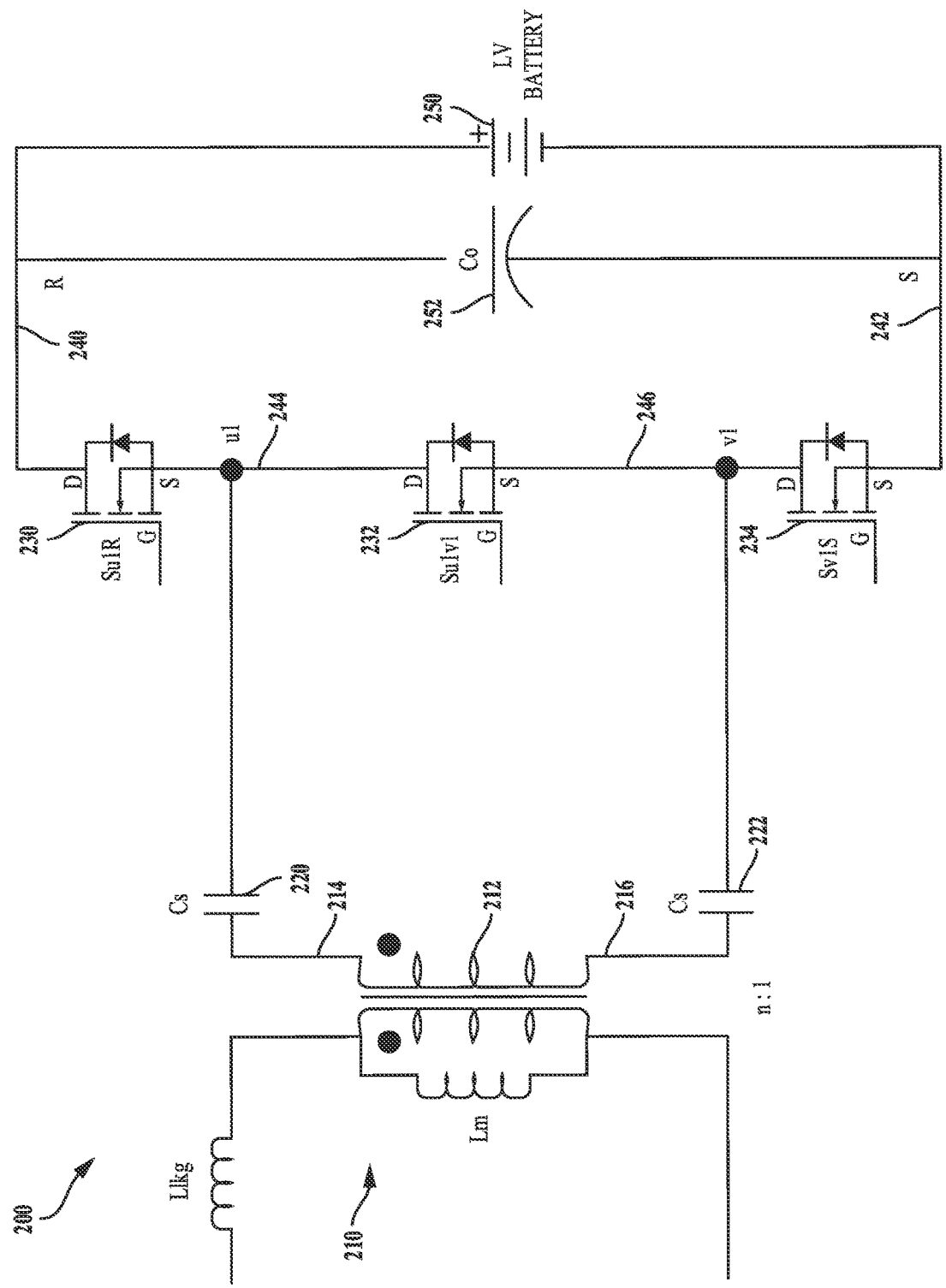
FIG. 2 is circuit diagram of an example of a system including a hybrid two-level half bridge converter.

FIG. 2 is circuit diagram of an example of a system 200 including a hybrid two-level half bridge converter. The system 200 includes a transformer 210 including a secondary winding 212 connecting a first tap 214 and a second tap 216; a first capacitor 220 connecting the first tap 214 to a first node 244; a second capacitor 222 connecting the second tap 216 to a second node 246; a first switch 230 connecting the first node 244 to a first terminal 240; a second switch 232 connecting the first node 244 to the second node 246; and a third switch 234 connecting the second node 246 to a second terminal 242. The system 200 includes an electrical load 250 connected between the first terminal 240 and the second terminal 242. The electrical load 250 may include a battery (e.g., a 12 Volt, a 48 volt, a 400 volt, or an 800 volt battery). The system 200 includes a capacitor 252 in parallel with the electrical load 250. For example, the system 200 may be implemented as part of the system 100 of FIG. 1A. For example, the system 200 may be implemented as part of the system 140 of FIG. 1B. For example, the system 200 may be implemented as part of the system 160 of FIG. 1C.

The system 200 includes a transformer 210 including a secondary winding 212 connecting a first tap 214 and a second tap 216. In some implementations (not shown), the transformer 210 may be replaced with the transformer 300 of FIG. 3A. In some implementations (not shown), the transformer 210 may be replaced with the transformer 350 of FIG. 3B. In some implementations (not shown), a transformer winding may be swapped out to extend zero voltage switching in a wide input and/or output voltage range.

The system 200 includes an electrical load 250 connected between the first terminal 240 and the second terminal 242. For example, the electrical load 250 may include a battery (e.g., a 12 volt battery or a 48 volt battery).

The system 200 may include a rectifier, connecting the secondary winding 212 of the transformer 210 to the electrical load 250. The rectifier may be symmetric with respect to the first tap 214 and the second tap 216 of the secondary winding 212. The topology of the rectifier and/or a symmetric modulation scheme to control the switches (230, 232, and 234) of the rectifier may provide advantages over conventional half-bridge rectifiers. For example, the symmetric topology of the rectifier of the system 200 may enable reduction of unequal common-mode noise from switching. For example, the symmetric topology of the rectifier of the system 200 may enable the use components (e.g., capacitors or switches) with voltage ratings of half of the voltage level of the electrical load 250. For example, the symmetric topology of the rectifier of the system 200 may enable equal time derivative of the voltage signals at switch nodes. For example, the symmetric topology of the rectifier of the system 200 may enable full zero voltage switching operation for higher power conversion efficiency.

The system 200 includes a first capacitor 220 connecting the first tap 214 to a first node 244. The system 200 includes a second capacitor 222 connecting the second tap 216 to a second node 246. The first capacitor 220 and the second capacitor 222 may be direct current blocking series capacitors that can respectively have half of the voltage of rating of a single direct current blocking series capacitor in a conventional half-bridge rectifier. This may enable the use of smaller and/or less expensive capacitors, which may increase power density.

The system 200 includes a first switch 230 connecting the first node 244 to a first terminal 240, a second switch 232 connecting the first node 244 to the second node 246, and a third switch 234 connecting the second node 246 to a second terminal 242. For example, the first switch 230 may be a field effect transistor (e.g., an n channel metal oxide semiconductor field effect transistor) or another type of electronic switch. For example, the second switch 232 may be a field effect transistor (e.g., an n channel metal oxide semiconductor field effect transistor) or another type of electronic switch. For example, the third switch 234 may be a field effect transistor (e.g., an n channel metal oxide semiconductor field effect transistor) or another type of electronic switch. In some implementations, the control signals (e.g., gate voltages) applied to the first switch 230, the second switch 232, and the third switch 234 are configured such that the first switch 230, the second switch 232, and the third switch 234 are not closed and conducting simultaneously to avoid shorting the electrical load 250 that is connected between the first terminal 240 and the second terminal 242.

Control signals (e.g., gate voltages) for the switches (230, 232, and 234) of the system 200 may be generated using a modulation scheme for synchronous rectification of an AC voltage signal transferring power through the transformer 210. Two-level voltage generation may be used for the AC voltage signal on the transformer 210. For example, a modulation scheme may be implemented to control the switches (230, 232, and 234) for two-level half-bridge rectification. The modulation scheme may synchronously alternate between a first modulation state, in which the first switch 230 and the third switch 234 are closed (e.g., conducting) and the second switch 232 is open (e.g., non-conducting) while the voltage on the transformer 210 is positive or high, and a second modulation state, in which the first switch 230 and the third switch 234 are open and the second switch 232 is closed while the voltage on the transformer 210 is negative or low. Using these two symmetric modulation states may serve to reduce common-mode noise and thus enable the use smaller electromagnetic interference filters or the omission of electromagnetic interference filters in some systems.

Figure 3B:
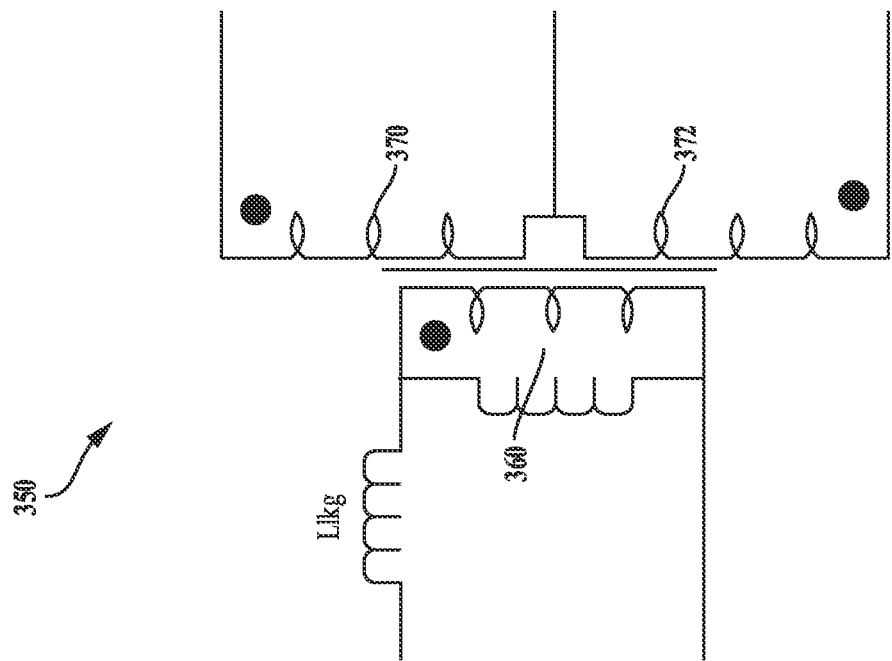
FIG. 3B is a circuit diagram of an example of a transformer.
Figure 3A:
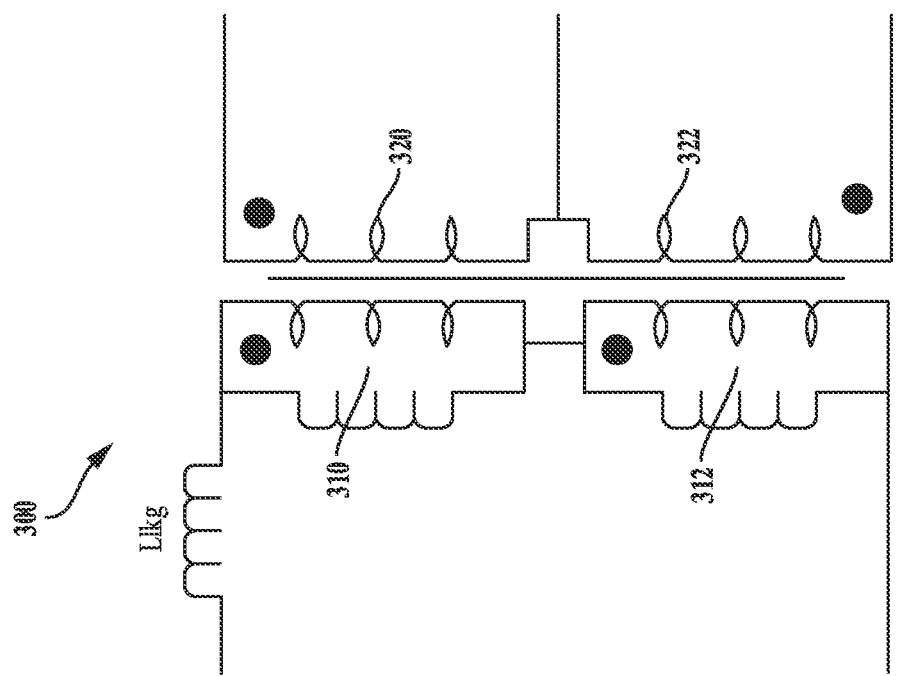
FIG. 3A is a circuit diagram of an example of a transformer.

FIGS. 3A and 3B show two examples of transformers that can be used in power converter systems described herein. FIG. 3A is a circuit diagram of an example of a transformer 300. The transformer 300 includes a first primary winding 310 and second primary winding 312 that are connected in series between two taps of the transformer 300. The transformer 300 includes a first secondary winding 320 and second secondary winding 322 that are magnetically coupled respectively to the first primary winding 310 and the second primary winding 312.

FIG. 3B is a circuit diagram of an example of a transformer 350. The transformer 350 includes a primary winding 360 that is magnetically coupled to both a first secondary winding 370 and second secondary winding 372. There may be design trade-offs between using the transformer 300 versus the transformer 350 in a power converter system (e.g., the system 100 of FIG. 1A). For example, the transformer 300 may be easier and less expensive to manufacture than the transformer 350. For example, the transformer 350 may be smaller than transformer 300 and may enable greater power density in a power converter.

Figure 4:
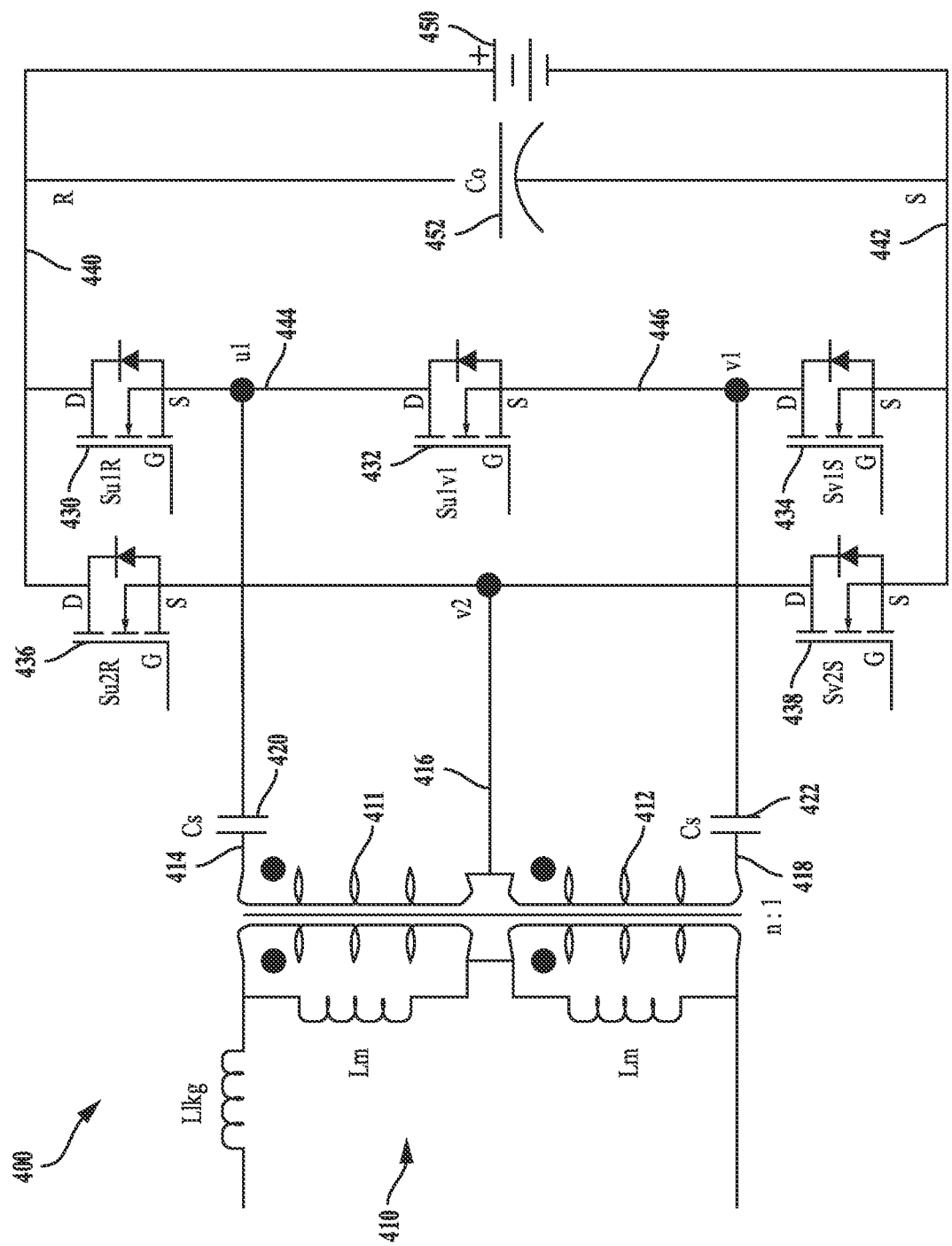
FIG. 4 is a circuit diagram of an example of a system including a hybrid half bridge converter.

FIG. 4 is a circuit diagram of an example of a system 400 including a hybrid half bridge converter. The system 400 includes a transformer 410 including a first secondary winding 411 and a second secondary winding 412. The system 400 includes a rectifier, including a set of switches (430, 432, 434, 436, and 438), that connects taps of the first secondary winding and the second secondary winding to a first terminal and a second terminal. The rectifier may be symmetric with respect to the first secondary winding 411 and the second secondary winding 412. The system 400 includes a first capacitor 420 connecting a first tap 414 of the first secondary winding 411 to a first node 444 of the rectifier; and a second capacitor 422 connecting a second tap (e.g., the third tap 418) of the second secondary winding 412 to a second node 446 of the rectifier. The system 400 includes an electrical load 450 connected between the first terminal 440 and the second terminal 442. The electrical load 450 may include a battery (e.g., a 12 volt, a 48 volt, a 400 volt, or an 800 volt battery) connected between the first terminal 440 and the second terminal 442. The rectifier includes a capacitor 452 in parallel with the electrical load 450. For example, the system 400 may be implemented as part of the system 100 of FIG. 1A. For example, the system 400 may be implemented as part of the system 140 of FIG. 1B. For example, the system 400 may be implemented as part of the system 160 of FIG. 1C.

In some implementations (not shown), the system 400 may include a processing apparatus (e.g., the processing apparatus 1010 of FIG. 10) that is configured to control the set of switches (430, 432, 434, 436, and 438) to rectify a multilevel voltage signal on the transformer 410. For example, the processing apparatus may be configured to select a modulation scheme from among two or more modulation schemes based on a measured voltage level of the battery (of the electrical load 450). For example, a voltage sensor (e.g., a voltmeter) may be used to measure the voltage level of the battery during operation of the system 400 to determine the measured voltage level. In some implementations, a first modulation scheme of the two or more modulation schemes includes modulation states that individually utilize one at a time of the first secondary winding 411 and the second secondary winding 412 to conduct current through the battery (of the electrical load 450), and a second modulation scheme of the two or more modulation schemes lacks modulation states that individually utilize one at a time of the first secondary winding 411 and the second secondary winding 412 to conduct current through the battery. For example, the modulation scheme 500 of FIG. 5 may be used when the measured battery voltage is near a high end of an operating range of the battery (e.g., 60 volts) and the modulation scheme 600 of FIG. 6 may be used when the measured battery voltage is near a low end of an operating range of the battery (e.g., 30 volts).

The system 400 includes a transformer 410 including a first secondary winding 411, connecting a first tap 414 and a second tap 416, and a second secondary winding 412, connecting a third tap 418 and the second tap 416. For example, the transformer 410 may be the transformer 300 of FIG. 3A. In some implementations (not shown), the transformer 410 may be replaced with the transformer 350 of FIG. 3B. In some implementations (not shown), a transformer winding may be swapped out to extend zero voltage switching in a wide input and/or output voltage range.

The system 400 includes an electrical load 450 connected between the first terminal 440 and the second terminal 442. For example, the electrical load 450 may include a battery (e.g., a 12 volt battery or a 48 volt battery).

The system 400 may include a rectifier, connecting the first secondary winding 411 and the second secondary winding 412 of the transformer 410 to the electrical load 450. The rectifier may be symmetric with respect to the first tap 414 and the third tap 418. The topology of the rectifier and/or a symmetric modulation scheme to control the switches (430, 432, 434, 436 and 438) of the rectifier may provide advantages over conventional half-bridge rectifiers. For example, the symmetric topology of the rectifier of the system 400 may enable reduction of unequal switching common-mode noise at transformer nodes. For example, the symmetric topology of the rectifier of the system 400 may enable the option to swap-out a transformer winding to extend zero voltage switching in a wide input and/or output voltage range. For example, the symmetric topology of the rectifier of the system 400 may enable full transformer utilization (e.g., using both the first secondary winding 411 and the second secondary winding 412 simultaneously) at higher battery voltages, while enabling bypass of a transformer winding (e.g., the first secondary winding 411 or the second secondary winding 412) under low battery voltage operation. For example, the symmetric topology of the rectifier of the system 400 may enable full zero voltage switching operation for higher power conversion efficiency.

The system 400 includes a first capacitor 420 connecting the first tap 414 to a first node 444. The system 400 includes a second capacitor 422 connecting the third tap 418 to a second node 446. The first capacitor 420 and the second capacitor 422 may be direct current blocking series capacitors that can respectively have half of the voltage of rating of a single direct current blocking series capacitor in a conventional half-bridge rectifier. This may enable the use of smaller and/or less expensive capacitors, which may increase power density.

The system 400 includes a first switch 430 connecting the first node 444 to a first terminal 440, a second switch 432 connecting the first node 444 to the second node 446, and a third switch 434 connecting the second node 446 to a second terminal 442. For example, the first switch 430 may be a field effect transistor (e.g., an n channel metal oxide semiconductor field effect transistor) or another type of electronic switch. For example, the second switch 432 may be a field effect transistor (e.g., an n channel metal oxide semiconductor field effect transistor) or another type of electronic switch. For example, the third switch 434 may be a field effect transistor (e.g., an n channel metal oxide semiconductor field effect transistor) or another type of electronic switch. In some implementations, the control signals (e.g., gate voltages) applied to the first switch 430, the second switch 432, and the third switch 434 are configured such that the first switch 430, the second switch 432, and the third switch 434 are not closed and conducting simultaneously to avoid shorting the electrical load 450 that is connected between the first terminal 440 and the second terminal 442.

The system 400 includes a fourth switch 436 connecting the second tap 416 to the first terminal 440, and a fifth switch 438 connecting the second tap 416 to the second terminal 442. For example, the fourth switch 436 may be a field effect transistor (e.g., an n channel metal oxide semiconductor field effect transistor) or another type of electronic switch. For example, the fifth switch 438 may be a field effect transistor (e.g., an n channel metal oxide semiconductor field effect transistor) or another type of electronic switch. In some implementations, the control signals (e.g., gate voltages) applied to the fourth switch 436 and the fifth switch 438 are configured such that the fourth switch 436 and the fifth switch 438 are not closed and conducting simultaneously to avoid shorting the electrical load 450 that is connected between the first terminal 440 and the second terminal 442.

Figure 5:
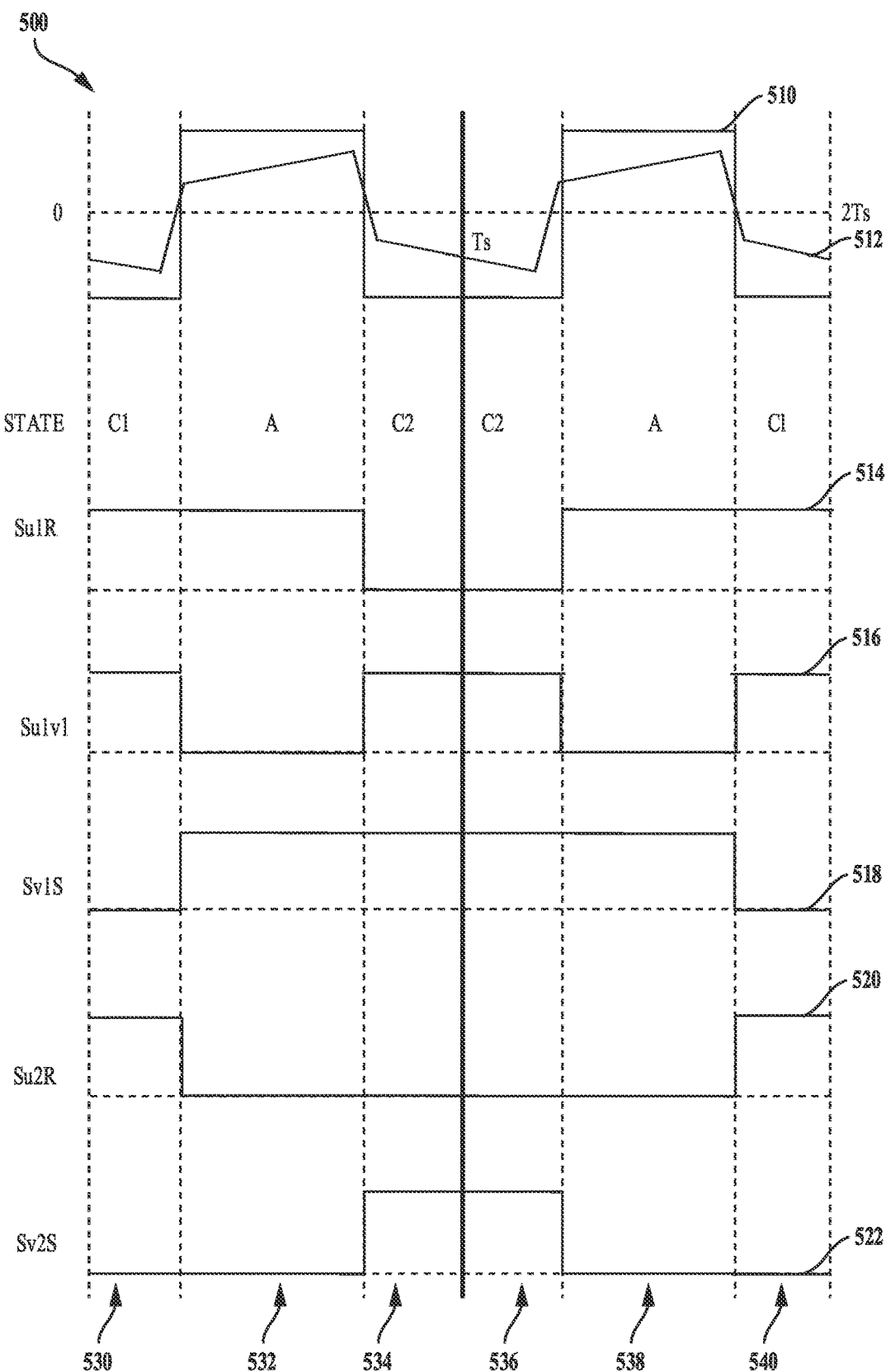
FIG. 5 is a plot of an example of a modulation scheme for switches of a hybrid half bridge converter with corresponding transformer voltage and current signals.

FIG. 5 is a plot of an example of a modulation scheme 500 for switches of a hybrid half bridge converter with corresponding transformer voltage and current signals. For example, the modulation scheme 500 may be used with the system 400 when a battery of the electrical load 450 is measured to have a voltage level (e.g., 60 volts) near an upper end of an operating range for the battery. The modulation scheme 500 may be used to control the switches (430, 432, 434, 436, and 438) of the system 400 to rectify voltage on the transformer 410. The plot of the modulation scheme 500 includes a plot of a voltage signal 510 across a primary winding of the transformer 410; a plot of a current signal 512 through a primary winding of the transformer 410; a plot of Su1R 514, which is a control signal (e.g., a gate voltage) that controls the switch 430; a plot of Su1$v$1 516, which is a control signal (e.g., a gate voltage) that controls the switch 432; a plot of Sv1S 518, which is a control signal (e.g., a gate voltage) that controls the switch 434; a plot of Su2R 520, which is a control signal (e.g., a gate voltage) that controls the switch 436; and a plot of Sv2S 522, which is a control signal (e.g., a gate voltage) that controls the switch 438. The plot is divided horizontally into time intervals (530-540) corresponding to modulation states of the modulation scheme 500. The modulation scheme 500 may be implemented by a system including a processing apparatus (e.g., the system 1000, including the processing apparatus 1010, of FIG. 10) and the system 400. The processing apparatus may be configured to control the first switch 430, the second switch 432, the third switch 434, the fourth switch 436, and the fifth switch 438 to rectify the multilevel voltage signal 510 on the transformer 410. For example, the voltage signal 510 and the current signal 512 may be generated based in part on control of synchronous switching in an inverter (e.g., the inverter 120 or the inverter 1042) connected to taps of the primary winding of the transformer 410.

The plot of the modulation scheme 500 covers two periods (t=0 to t=T_s and t=T_s to t=2*T_s) of the voltage signal 510 on the transformer. During the time interval 530 (starting at time t=0) the modulation scheme 500 is in a state labeled "C1" where the voltage signal 510 is negative and the control signals Su1R 514, Su1$v$1 516, and Su2R 520 are high and the control signals Sv1S 518 and Sv2S 522 are low, corresponding to switch 430, switch 432, and switch 436 being in a closed (e.g., conducting) state and to switch 434 and switch 438 being in a an open (e.g., non-conducting) state. During the time interval 532 the state of the modulation scheme 500 is labeled "A" where the voltage signal 510 is positive and the control signals Su1R 514 and Sv1S 518 are high and the control signals Su1$v$1 516, Su2R 520, and Sv2S 522 are low, corresponding to switch 432, switch 436, and switch 438 being in an open state and to switch 430 and switch 434 being in a closed state. During the time interval 534 the state of the modulation scheme 500 is labeled "C2" where the voltage signal 510 is negative and the control signals Su1$v$1 516, Sv1S 518, and Sv2S 522 are high and the control signals Su1R 514 and Su2R 520 are low, corresponding to switch 432, switch 434, and switch 438 being in a closed state and to switch 430 and switch 436 being in an open state. During the time interval 536 the state of the modulation scheme 500 is labeled "C2" where the voltage signal 510 is negative and the control signals Su1$v$1 516, Sv1S 518, and Sv2S 522 are high and the control signals Su1R 514 and Su2R 520 are low, corresponding to switch 432, switch 434, and switch 438 being in a closed state and to switch 430 and switch 436 being in an open state. During the time interval 538 the state of the modulation scheme 500 is labeled "A" where the voltage signal 510 is positive and the control signals Su1R 514 and Sv1S 518 are high and the control signals Su1$v$1 516, Su2R 520, and Sv2S 522 are low, corresponding to switch 432, switch 436, and switch 438 being in an open state and to switch 430 and switch 434 being in a closed state. During the time interval 540 the state of the modulation scheme 500 is labeled "C1" where the voltage signal 510 is negative and the control signals Su1R 514, Su1$v$1 516, and Su2R 520 are high and the control signals Sv1S 518 and Sv2S 522 are low, corresponding to switch 430, switch 432, and switch 436 being in a closed state and to switch 434 and switch 438 being in a an open state.

For example, the modulation scheme 500 includes: in a first state (e.g., labeled "C1") corresponding to a first voltage level (e.g., a negative voltage level), opening the third switch 434 and the fifth switch 438 and closing the first switch 430, the second switch 432, and the fourth switch 436; and in a second state (e.g., labeled "C2") corresponding to the first voltage level, opening the first switch 430 and the fourth switch 436 and closing the second switch 432, the third switch 434, and the fifth switch 438. In some implementations, a processing apparatus (e.g. the processing apparatus 1010 of FIG. 10) is configured to change a phase of the first state and the second state between periods of the multilevel voltage signal 510 on the transformer 410.

The modulation scheme 500 may provide some advantages. For example, the modulation scheme 500 may be used with the system 400 when a battery of the electrical load 450 is measured to have a voltage level (e.g., 60 volts) near an upper end of an operating range for the battery, as part of supporting a wide input and/or output voltage level. The modulation scheme 500 may enable full elimination of unequal switching common-mode noise at the transformer 410 nodes. For example, the modulation scheme 500 may enable full transformer utilization (e.g., using both the first secondary winding 411 and the second secondary winding 412 simultaneously) at higher battery voltages. Both transformer windings (411 and 412) are utilized to get full voltage usage of battery and transformers. For example, the first secondary winding 411 and the second secondary winding 412 may respectively see half the battery voltage. For example, the modulation scheme 500 may enable full zero voltage switching operation for higher power conversion efficiency.

Figure 6:
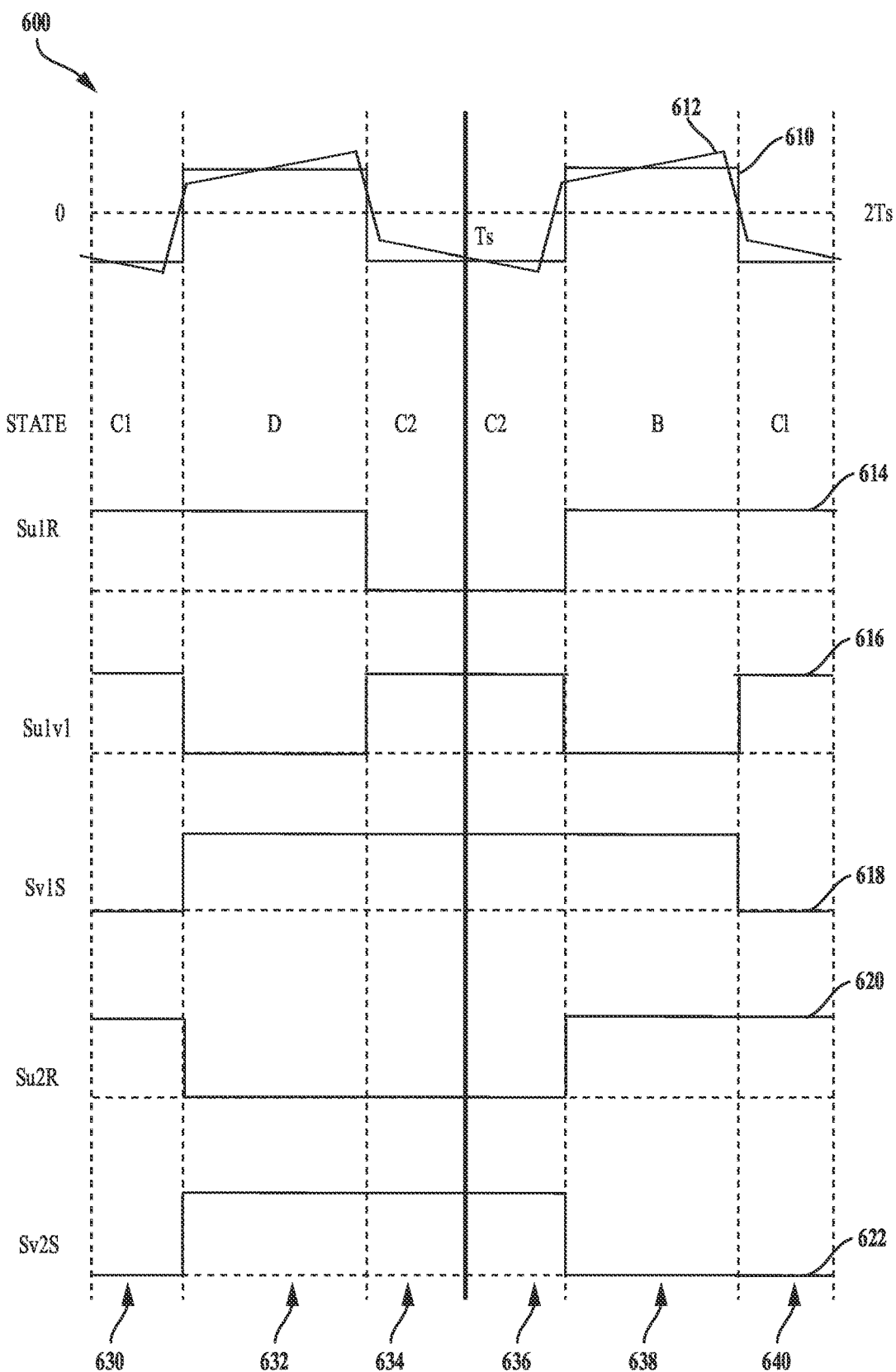
FIG. 6 is a plot of an example of a modulation scheme for switches of a hybrid half bridge converter with corresponding transformer voltage and current signals.

FIG. 6 is a plot of an example of a modulation scheme 600 for switches of a hybrid half bridge converter with corresponding transformer voltage and current signals. For example, the modulation scheme 600 may be used with the system 400 when a battery of the electrical load 450 is measured to have a voltage level (e.g., 30 volts) near a lower end of an operating range for the battery. The modulation scheme 600 may be used to control the switches (430, 432, 434, 436, and 438) of the system 400 to rectify voltage on the transformer 410. The plot of the modulation scheme 600 includes a plot of a voltage signal 610 across a primary winding of the transformer 410; a plot of a current signal 612 through a primary winding of the transformer 410; a plot of Su1R 614, which is a control signal (e.g., a gate voltage) that controls the switch 430; a plot of Su1ν1 616, which is a control signal (e.g., a gate voltage) that controls the switch 432; a plot of Sv1S 618, which is a control signal (e.g., a gate voltage) that controls the switch 434; a plot of Su2R 620, which is a control signal (e.g., a gate voltage) that controls the switch 436; and a plot of Sv2S 622, which is a control signal (e.g., a gate voltage) that controls the switch 438. The plot is divided horizontally into time intervals (630-640) corresponding to modulation states of the modulation scheme 600. The modulation scheme 600 may be implemented by a system including a processing apparatus (e.g., the system 1000, including the processing apparatus 1010, of FIG. 10) and the system 400. The processing apparatus may be configured to control the first switch 430, the second switch 432, the third switch 434, the fourth switch 436, and the fifth switch 438 to rectify the multilevel voltage signal 610 on the transformer 410. For example, the voltage signal 610 and the current signal 612 may be generated based in part on control of synchronous switching in an inverter (e.g., the inverter 120 or the inverter 1042) connected to taps of the primary winding of the transformer 410.

The plot of the modulation scheme 600 covers two periods (t=0 to t=T_s and t=T_s to t=2*T_s) of the voltage signal 610 on the transformer. During the time interval 630 (starting at time t=0) the modulation scheme 600 is in a state labeled "C1" where the voltage signal 610 is negative and the control signals Su1R 614, Su1ν1 616, and Su2R 620 are high and the control signals Sv1S 618 and Sv2S 622 are low, corresponding to switch 430, switch 432, and switch 436 being in a closed (e.g., conducting) state and to switch 434 and switch 438 being in a an open (e.g., non-conducting) state. During the time interval 632 the state of the modulation scheme 600 is labeled "D" where the voltage signal 610 is positive and the control signals Su1R 614, Sv1S 618, and Sv2S 622 are high and the control signals Su1ν1 616 and Su2R 620 are low, corresponding to switch 432 and switch 436 being in an open state and to switch 430, switch 434, and switch 438 being in a closed state. During the time interval 634 the state of the modulation scheme 600 is labeled "C2" where the voltage signal 610 is negative and the control signals Su1ν1 616, Sv1S 618, and Sv2S 622 are high and the control signals Su1R 614 and Su2R 620 are low, corresponding to switch 432, switch 434, and switch 438 being in a closed state and to switch 430 and switch 436 being in an open state. During the time interval 636 the state of the modulation scheme 600 is labeled "C2" where the voltage signal 610 is negative and the control signals Su1ν1 616, Sv1S 618, and Sv2S 622 are high and the control signals Su1R 614 and Su2R 620 are low, corresponding to switch 432, switch 434, and switch 438 being in a closed state and to switch 430 and switch 436 being in an open state. During the time interval 638 the state of the modulation scheme 600 is labeled "B" where the voltage signal 610 is positive and the control signals Su1R 614, Sv1S 618, and Su2R 620 are high and the control signals Su1ν1 616 and Sv2S 622 are low, corresponding to switch 432 and switch 438 being in an open state and to switch 430, switch 434, and switch 436 being in a closed state. During the time interval 640 the state of the modulation scheme 600 is labeled "C1" where the voltage signal 610 is negative and the control signals Su1R 614, Su1ν1 616, and Su2R 620 are high and the control signals Sv1S 618 and Sv2S 622 are low, corresponding to switch 430, switch 432, and switch 436 being in a closed state and to switch 434 and switch 438 being in a an open state.

For example, the modulation scheme 600 includes: in a first state (e.g., labeled "C1") corresponding to a first voltage level (e.g., a negative voltage level), opening the third switch 434 and the fifth switch 438 and closing the first switch 430, the second switch 432, and the fourth switch 436; and in a second state (e.g., labeled "C2") corresponding to the first voltage level, opening the first switch 430 and the fourth switch 436 and closing the second switch 432, the third switch 434, and the fifth switch 438. In some implementations, a processing apparatus (e.g. the processing apparatus 1010 of FIG. 10) is configured to change a phase of the first state and the second state between periods of the multilevel voltage signal 610 on the transformer 410. For example, the modulation scheme 600 includes: in a third state (e.g., labeled "B") corresponding to a second voltage level (e.g., a positive voltage level), opening the second switch 432 and the fifth switch 438 and closing the first switch 430, the third switch 434, and the fourth switch 434; and in a fourth state (e.g., labeled "D") corresponding to the second voltage level, opening the second switch 432 and the fourth switch 436 and closing the first switch 430, the third switch 434, and the fifth switch 438.

The modulation scheme 600 may provide some advantages. For example, the modulation scheme 600 may be used with the system 400 when a battery of the electrical load 450 is measured to have a voltage level (e.g., 30 volts) near a lower end of an operating range for the battery, as part of supporting a wide input and/or output voltage level. The modulation scheme 600 may enable reduction of unequal switching common-mode noise at transformer 410 nodes. For example, the modulation scheme 600 may enable full zero voltage switching operation for higher power conversion efficiency. For example, the modulation scheme 600 may swap-out one of the two transformer windings to utilize the low battery voltage condition and still push high current to facilitate zero voltage switching. For example, the first secondary winding 411 may be swapped-out during the modulation state labeled "B" (e.g., as shown in the time interval 638). For example, the second secondary winding 412 may be swapped-out during the modulation state labeled "D" (e.g., as shown in the time interval 632). Each secondary winding of the transformer 410 may be swapped-out in every other cycle to help balance current among windings.

Figure 7:
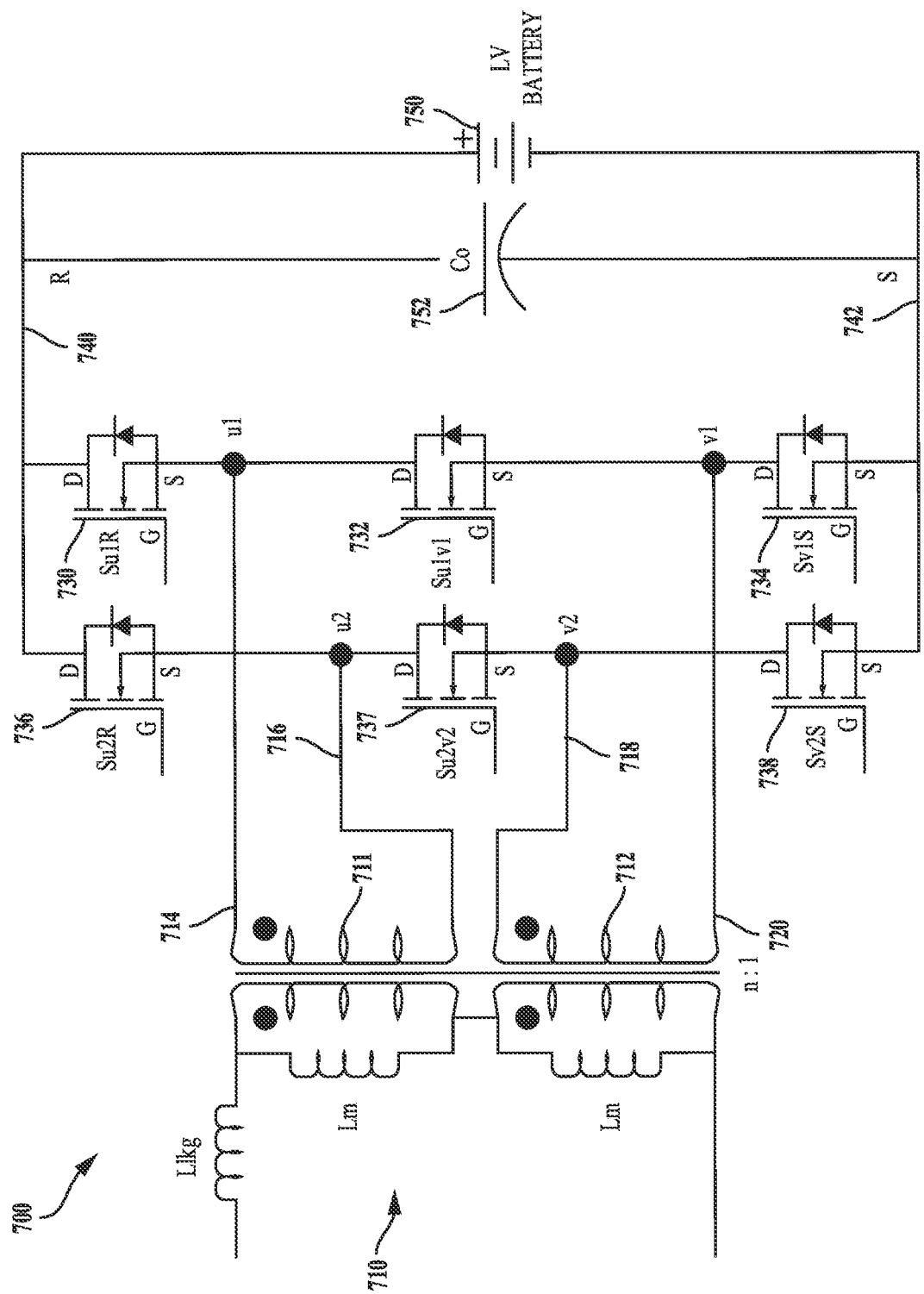
FIG. 7 is circuit diagram of an example of a system including a hybrid full bridge converter.

FIG. 7 is circuit diagram of an example of a system 700 including a hybrid full bridge converter. The system 700 includes a transformer 710 including a first secondary winding 711 and a second secondary winding 712. The system 700 includes a rectifier, including a set of switches (730, 732, 734, 736, 737, and 738), that connects taps of the first secondary winding and the second secondary winding to a first terminal and a second terminal. The rectifier may be symmetric with respect to the first secondary winding 711 and the second secondary winding 712. The system 700 includes an electrical load 750 connected between the first terminal 740 and the second terminal 742. The electrical load 750 may include a battery (e.g., a 12 volt, a 48 volt, a 400 volt, or an 800 volt battery) connected between the first terminal 740 and the second terminal 742. The rectifier includes a capacitor 752 in parallel with the electrical load 750. For example, the system 700 may be implemented as part of the system 100 of FIG. 1A. For example, the system 700 may be implemented as part of the system 140 of FIG. 1B. For example, the system 700 may be implemented as part of the system 160 of FIG. 1C.

In some implementations (not shown), the system 700 may include a processing apparatus (e.g., the processing apparatus 1010 of FIG. 10) that is configured to control the set of switches (730, 732, 734, 736, 737, and 738) to rectify a multilevel voltage signal on the transformer 710. For example, the processing apparatus may be configured to select a modulation scheme from among two or more modulation schemes based on a measured voltage level of the battery (of the electrical load 750). For example, a voltage sensor (e.g., a voltmeter) may be used to measure the voltage level of the battery during operation of the system 700 to determine the measured voltage level. In some implementations, a first modulation scheme of the two or more modulation schemes includes modulation states that individually utilize one at a time of the first secondary winding 711 and the second secondary winding 712 to conduct current through the battery (of the electrical load 750), and a second modulation scheme of the two or more modulation schemes lacks modulation states that individually utilize one at a time of the first secondary winding 711 and the second secondary winding 712 to conduct current through the battery. For example, the modulation scheme 800 of FIG. 8 may be used when the measured battery voltage is near a high end of an operating range of the battery (e.g., 60 volts) and the modulation scheme 900 of FIG. 9 may be used when the measured battery voltage is near a low end of an operating range of the battery (e.g., 30 volts).

The system 700 includes a transformer 710 including a first secondary winding 711, connecting a first tap 714 and a second tap 716, and a second secondary winding 712, connecting a third tap 718 and a fourth tap 720. For example, the transformer 710 may be the transformer 300 of FIG. 3A. In some implementations (not shown), the transformer 710 may be replaced with the transformer 350 of FIG. 3B. In some implementations (not shown), a transformer winding may be swapped out to extend zero voltage switching in a wide input and/or output voltage range.

The system 700 includes an electrical load 750 connected between the first terminal 740 and the second terminal 742. For example, the electrical load 750 may include a battery (e.g., a 12 volt battery or a 48 volt battery).

The system 700 includes a first switch 730 connecting the first tap 714 to a first terminal 740, a second switch 732 connecting the first tap 714 to the fourth tap 720, and a third switch 734 connecting the fourth tap 720 to a second terminal 742. For example, the first switch 730 may be a field effect transistor (e.g., an n channel metal oxide semiconductor field effect transistor) or another type of electronic switch. For example, the second switch 732 may be a field effect transistor (e.g., an n channel metal oxide semiconductor field effect transistor) or another type of electronic switch. For example, the third switch 734 may be a field effect transistor (e.g., an n channel metal oxide semiconductor field effect transistor) or another type of electronic switch. In some implementations, the control signals (e.g., gate voltages) applied to the first switch 730, the second switch 732, and the third switch 734 are configured such that the first switch 730, the second switch 732, and the third switch 734 are not closed and conducting simultaneously to avoid shorting the electrical load 750 that is connected between the first terminal 740 and the second terminal 742.

The system 700 includes a fourth switch 736 connecting the second tap 716 to the first terminal 740, a fifth switch 737 connecting the second tap 716 to the third tap 718, and a sixth switch 738 connecting the third tap 718 to the second terminal 742. For example, the fourth switch 736 may be a field effect transistor (e.g., an n channel metal oxide semiconductor field effect transistor) or another type of electronic switch. For example, the fifth switch 737 may be a field effect transistor (e.g., an n channel metal oxide semiconductor field effect transistor) or another type of electronic switch. For example, the sixth switch 738 may be a field effect transistor (e.g., an n channel metal oxide semiconductor field effect transistor) or another type of electronic switch. In some implementations, the control signals (e.g., gate voltages) applied to the fourth switch 736, the fifth switch 737, and the sixth switch 738 are configured such that the fourth switch 736, the fifth switch 737, and the sixth switch 738 are not closed and conducting simultaneously to avoid shorting the electrical load 750 that is connected between the first terminal 740 and the second terminal 742.

The system 700 may include a rectifier, connecting the first secondary winding 711 and the second secondary winding 712 of the transformer 710 to the electrical load 750. The rectifier may be symmetric with respect to the first tap 714 and the fourth tap 720. The topology of the rectifier and/or a symmetric modulation scheme to control the switches (730, 732, 734, 736, 737, and 738) of the rectifier may provide advantages over conventional full-bridge rectifiers. For example, the symmetric topology of the rectifier of the system 700 may enable reduction of unequal switching common-mode noise at transformer nodes. For example, the symmetric topology of the rectifier of the system 700 may enable full zero voltage switching operation for higher power conversion efficiency. For example, the symmetric topology of the rectifier of the system 700 may enable the option to swap-out a transformer winding to extend zero voltage switching in a wide input and/or output voltage range. For example, the symmetric topology of the rectifier of the system 700 may enable full transformer utilization (e.g., using both the first secondary winding 711 and the second secondary winding 712 simultaneously) at higher battery voltages, while enabling bypass of a transformer winding (e.g., the first secondary winding 711 or the second secondary winding 712) under low battery voltage operation. For example, the symmetric topology of the rectifier of the system 700 may support bipolar full-bridge voltage operation, which may enable the omission of blocking capacitors in the system 700.

Control signals (e.g., gate voltages) for the switches (730, 732, 734, 736, 737, and 738) of the system 700 may be generated using a modulation scheme for synchronous rectification of an AC voltage signal transferring power through the transformer 710. Multilevel voltage generation (e.g., three-level or five-level) may be used for the AC voltage signal on the transformer 710. Using a multilevel voltage signal on the transformer 710 may offer advantages, such as lowering the time derivative if the voltage across the transformer 710, which may reduce core losses in the transformer 710. Using a multilevel voltage signal on the transformer 710 may cause the current through the windings of the transformer 710 to more closely approximate sinusoidal currents, which may reduce copper losses. Using a multilevel voltage signal on the transformer 710 may enable greater control flexibility to cover wider input and/or output voltage fluctuations. For example, the modulation scheme 800 of FIG. 8 may be implemented to control the switches (730, 732, 734, 736, 737, and 738). For example, the modulation scheme 900 of FIG. 9 may be implemented to control the switches (730, 732, 734, 736, 737, and 738).

Figure 8:
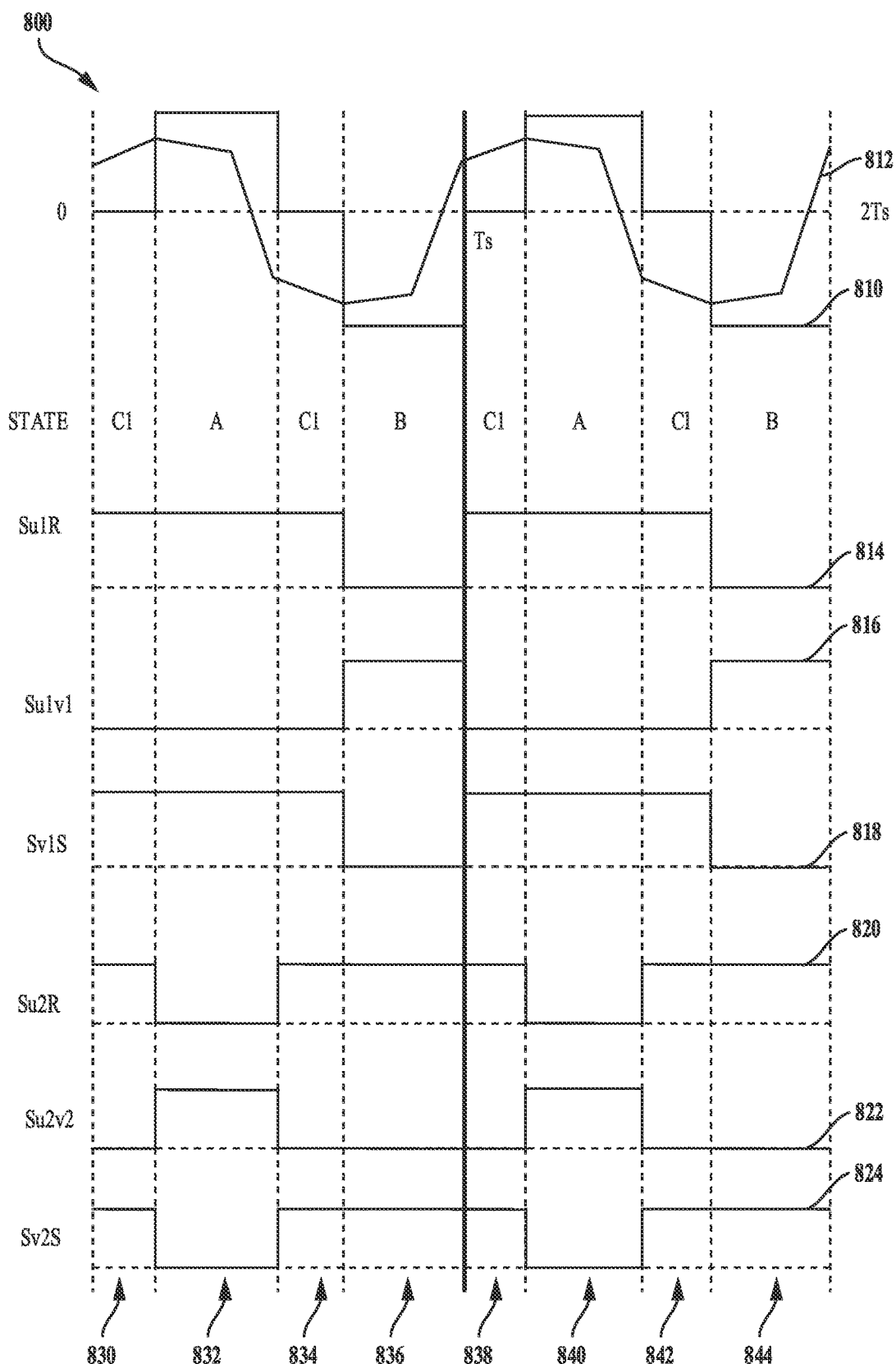
FIG. 8 is a plot of an example of a modulation scheme for switches of a hybrid full bridge converter with corresponding transformer voltage and current signals.

FIG. 8 is a plot of an example of a modulation scheme 800 for switches of a hybrid full bridge converter with corresponding transformer voltage and current signals. For example, the modulation scheme 800 may be used with the system 700 when a battery of the electrical load 750 is measured to have a voltage level (e.g., 60 volts) near an upper end of an operating range for the battery. The modulation scheme 800 may be used to control the switches (730, 732, 734, 736, 737, and 738) of the system 700 to rectify voltage on the transformer 710. The plot of the modulation scheme 800 includes a plot of a voltage signal 810 across a primary winding of the transformer 710; a plot of a current signal 812 through a primary winding of the transformer 710; a plot of Su1R 814, which is a control signal (e.g., a gate voltage) that controls the switch 730; a plot of Su1$v$1 816, which is a control signal (e.g., a gate voltage) that controls the switch 732; a plot of Sv1S 818, which is a control signal (e.g., a gate voltage) that controls the switch 734; a plot of Su2R 820, which is a control signal (e.g., a gate voltage) that controls the switch 736; a plot of Su2$v$2 822, which is a control signal (e.g., a gate voltage) that controls the switch 737; and a plot of Sv2S 824, which is a control signal (e.g., a gate voltage) that controls the switch 738. The plot is divided horizontally into time intervals (830-844) corresponding to modulation states of the modulation scheme 800. The modulation scheme 800 may be implemented by a system including a processing apparatus (e.g., the system 1000, including the processing apparatus 1010, of FIG. 10) and the system 700. The processing apparatus may be configured to control the first switch 730, the second switch 732, the third switch 734, the fourth switch 736, the fifth switch 737, and the sixth switch 738 to rectify the multilevel voltage signal 810 on the transformer 710. For example, the voltage signal 810 and the current signal 812 may be generated based in part on control of synchronous switching in an inverter (e.g., the inverter 120 or the inverter 1042) connected to taps of the primary winding of the transformer 710.

The plot of the modulation scheme 800 covers two periods (t=0 to t=T_s and t=T_s to t=2*T_s) of the voltage signal 810 on the transformer. During the time interval 830 (starting at time t=0) the modulation scheme 800 is in a state labeled "C1" where the voltage signal 810 is zero and the control signals Su1R 814, Sv1S 818, Su2R 820, and Sv2S 824 are high and the control signals Su1$v$1 816 and Su2$v$2 822 are low, corresponding to switch 730, switch 734, switch 736, and switch 738 being in a closed (e.g., conducting) state and to switch 732 and switch 737 being in an open (e.g., non-conducting) state. During the time interval 832 the state of the modulation scheme 800 is labeled "A" where the voltage signal 810 is positive and the control signals Su1R 814, Sv1S 818, and Su2$v$2 822 are high and the control signals Su1$v$1 816, Su2R 820, and Sv2S 824 are low, corresponding to switch 732, switch 736, and switch 738 being in an open state and to switch 730, switch 734, and switch 737 being in a closed state. During the time interval 834 the state of the modulation scheme 800 is labeled "C1" where the voltage signal 810 is zero and the control signals Su1R 814, Sv1S 818, Su2R 820, and Sv2S 824 are high and the control signals Su1$v$1 816 and Su2$v$2 822 are low, corresponding to switch 730, switch 734, switch 736, and switch 738 being in a closed state and to switch 732 and switch 737 being in an open state. During the time interval 836 the state of the modulation scheme 800 is labeled "B" where the voltage signal 810 is negative and the control signals Su1$v$1 816, Su2R 820, and Sv2S 824 are high and the control signals Su1R 814, Sv1S 818, and Su2$v$2 822 are low, corresponding to switch 732, switch 736, and switch 738 being in a closed state and to switch 730, switch 734, and switch 737 being in an open state. During the time interval 838 the state of the modulation scheme 800 is labeled "C1" where the voltage signal 810 is zero and the control signals Su1R 814, Sv1S 818, Su2R 820, and Sv2S 824 are high and the control signals Su1$v$1 816 and Su2$v$2 822 are low, corresponding to switch 730, switch 734, switch 736, and switch 738 being in a closed state and to switch 732 and switch 737 being in an open state. During the time interval 840 the state of the modulation scheme 800 is labeled "A" where the voltage signal 810 is positive and the control signals Su1R 814, Sv1S 818, and Su2$v$2 822 are high and the control signals Su1$v$1 816, Su2R 820, and Sv2S 824 are low, corresponding to switch 732, switch 736, and switch 738 being in an open state and to switch 730, switch 734, and switch 737 being in a closed state. During the time interval 842 the state of the modulation scheme 800 is labeled "C1" where the voltage signal 810 is zero and the control signals Su1R 814, Sv1S 818, Su2R 820, and Sv2S 824 are high and the control signals Su1$v$1 816 and Su2$v$2 822 are low, corresponding to switch 730, switch 734, switch 736, and switch 738 being in a closed state and to switch 732 and switch 737 being in an open state. During the time interval 844 the state of the modulation scheme 800 is labeled "B" where the voltage signal 810 is negative and the control signals Su1$v$1 816, Su2R 820, and Sv2S 824 are high and the control signals Su1R 814, Sv1S 818, and Su2$v$2 822 are low, corresponding to switch 732, switch 736, and switch 738 being in a closed state and to switch 730, switch 734, and switch 737 being in an open state.

The modulation scheme 800 may provide some advantages. For example, the modulation scheme 800 may be used with the system 700 when a battery of the electrical load 750 is measured to have a voltage level (e.g., 60 volts) near an upper end of an operating range for the battery, as part of supporting a wide input and/or output voltage level. The modulation scheme 800 may enable full elimination of unequal switching common-mode noise at the transformer 710 nodes. For example, the modulation scheme 800 may enable full zero voltage switching operation for higher power conversion efficiency. For example, the modulation scheme 800 may enable full transformer utilization (e.g., using both the first secondary winding 711 and the second secondary winding 712 simultaneously) at higher battery voltages. Both transformer windings (711 and 712) are utilized to get full voltage usage of battery and transformers. For example, the first secondary winding 711 and the second secondary winding 712 may respectively see half the battery voltage.

Figure 9:
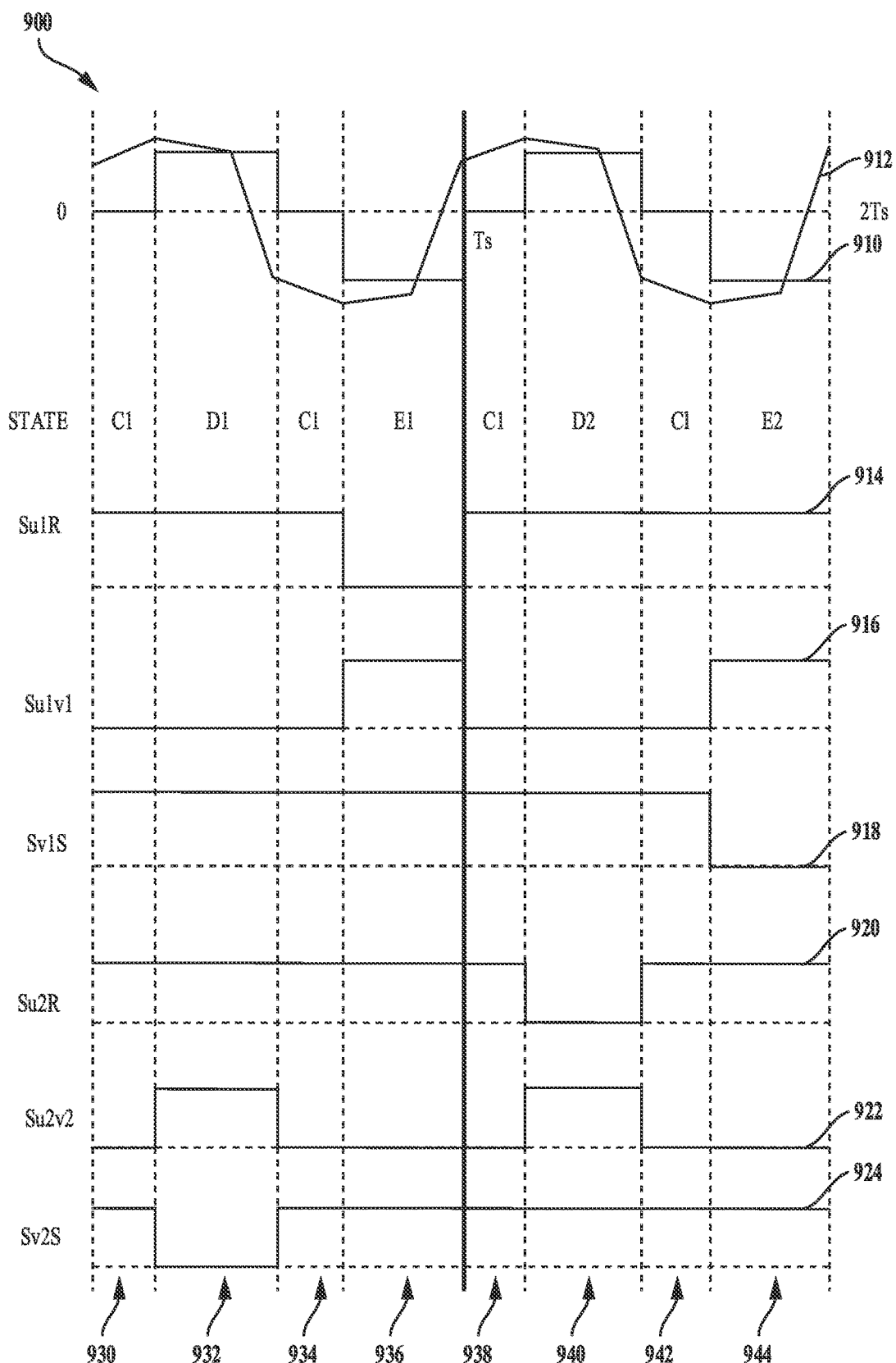
FIG. 9 is a plot of an example of a modulation scheme for switches of a hybrid full bridge converter with corresponding transformer voltage and current signals.

FIG. 9 is a plot of an example of a modulation scheme 900 for switches of a hybrid full bridge converter with corresponding transformer voltage and current signals. For example, the modulation scheme 900 may be used with the system 700 when a battery of the electrical load 750 is measured to have a voltage level (e.g., 30 volts) near a lower end of an operating range for the battery. The modulation scheme 900 may be used to control the switches (730, 732, 734, 736, 737, and 738) of the system 700 to rectify voltage on the transformer 710. The plot of the modulation scheme 900 includes a plot of a voltage signal 910 across a primary winding of the transformer 710; a plot of a current signal 912 through a primary winding of the transformer 710; a plot of Su1R 914, which is a control signal (e.g., a gate voltage) that controls the switch 730; a plot of Su1$v$1 916, which is a control signal (e.g., a gate voltage) that controls the switch 732; a plot of Sv1S 918, which is a control signal (e.g., a gate voltage) that controls the switch 734; a plot of Su2R 920, which is a control signal (e.g., a gate voltage) that controls the switch 736; a plot of Su2$v$2 922, which is a control signal (e.g., a gate voltage) that controls the switch 737; and a plot of Sv2S 924, which is a control signal (e.g., a gate voltage) that controls the switch 738. The plot is divided horizontally into time intervals (930-944) corresponding to modulation states of the modulation scheme 900. The modulation scheme 900 may be implemented by a system including a processing apparatus (e.g., the system 1000, including the processing apparatus 1010, of FIG. 10) and the system 700. The processing apparatus may be configured to control the first switch 730, the second switch 732, the third switch 734, the fourth switch 736, the fifth switch 737, and the sixth switch 738 to rectify the multilevel voltage signal 910 on the transformer 710. For example, the voltage signal 910 and the current signal 912 may be generated based in part on control of synchronous switching in an inverter (e.g., the inverter 120 or the inverter 1042) connected to taps of the primary winding of the transformer 710.

The plot of the modulation scheme 900 covers two periods (t=0 to t=T_s and t=T_s to t=2*T_s) of the voltage signal 910 on the transformer 710. During the time interval 930 (starting at time t=0) the modulation scheme 900 is in a state labeled "C1" where the voltage signal 910 is zero and the control signals Su1R 914, Sv1S 918, Su2R 920, and Sv2S 924 are high and the control signals Su1$v$1 916 and Su2$v$2 922 are low, corresponding to switch 730, switch 734, switch 736, and switch 738 being in a closed (e.g., conducting) state and to switch 732 and switch 737 being in an open (e.g., non-conducting) state. During the time interval 932 the state of the modulation scheme 900 is labeled "D1" where the voltage signal 910 is positive and the control signals Su1R 914, Sv1S 918, Su2R 920, and Su2$v$2 922 are high and the control signals Su1$v$1 916 and Sv2S 924 are low, corresponding to switch 732 and switch 738 being in an open state and to switch 730, switch 734, switch 736, and switch 737 being in a closed state. During the time interval 934 the state of the modulation scheme 900 is labeled "C1" where the voltage signal 910 is zero and the control signals Su1R 914, Sv1S 918, Su2R 920, and Sv2S 924 are high and the control signals Su1$v$1 916 and Su2$v$2 922 are low, corresponding to switch 730, switch 734, switch 736, and switch 738 being in a closed state and to switch 732 and switch 737 being in an open state. During the time interval 936 the state of the modulation scheme 900 is labeled "E1" where the voltage signal 910 is negative and the control signals Su1$v$1 916, Sv1S 918, Su2R 920, and Sv2S 924 are high and the control signals Su1R 914 and Su2$v$2 922 are low, corresponding to switch 732, switch 734, switch 736, and switch 738 being in a closed state and to switch 730 and switch 737 being in an open state. During the time interval 938 the state of the modulation scheme 900 is labeled "C1" where the voltage signal 910 is zero and the control signals Su1R 914, Sv1S 918, Su2R 920, and Sv2S 924 are high and the control signals Su1$v$1 916 and Su2$v$2 922 are low, corresponding to switch 730, switch 734, switch 736, and switch 738 being in a closed state and to switch 732 and switch 737 being in an open state. During the time interval 940 the state of the modulation scheme 900 is labeled "D2" where the voltage signal 910 is positive and the control signals Su1R 914, Sv1S 918, Su2$v$2 922, and Sv2S 924 are high and the control signals Su1$v$1 916, Su2R 920, are low, corresponding to switch 732 and switch 736 being in an open state and to switch 730, switch 734, switch 737, and switch 738 being in a closed state. During the time interval 942 the state of the modulation scheme 900 is labeled "C1" where the voltage signal 910 is zero and the control signals Su1R 914, Sv1S 918, Su2R 920, and Sv2S 924 are high and the control signals Su1$v$1 916 and Su2$v$2 922 are low, corresponding to switch 730, switch 734, switch 736, and switch 738 being in a closed state and to switch 732 and switch 737 being in an open state. During the time interval 944 the state of the modulation scheme 900 is labeled "E2" where the voltage signal 910 is negative and the control signals Su1R 914, Su1$v$1 916, Su2R 920, and Sv2S 924 are high and the control signals Sv1S 918, and Su2$v$2 922 are low, corresponding to switch 730, switch 732, switch 736, and switch 738 being in a closed state and to switch 734, and switch 737 being in an open state.

For example, the modulation scheme 900 includes: in a first state (e.g., labeled "D1") corresponding to a first voltage level (e.g., a positive voltage level), opening the second switch 732 and the sixth switch 738 and closing the first switch 730, the third switch 734, the fourth switch 736, and the fifth switch 737; and in a second state (e.g., labeled "D2") corresponding to the first voltage level, opening the second switch 732 and the fourth switch 736 and closing the first switch 730, the third switch 734, the fifth switch 737, and the sixth switch 738. For example, the modulation scheme 900 includes: in a third state (e.g., labeled "E1") corresponding to a second voltage level (e.g., a negative voltage level), opening the first switch 730 and the fifth switch 737 and closing the second switch 732, the third switch 734, the fourth switch 736, and the sixth switch 738; and in a fourth state (e.g., labeled "E2") corresponding to the second voltage level, opening the third switch 734 and the fifth switch 737 and closing the first switch 730, the second switch 732, the fourth switch 736, and the sixth switch 738.

The modulation scheme 900 may provide some advantages. For example, the modulation scheme 900 may be used with the system 700 when a battery of the electrical load 750 is measured to have a voltage level (e.g., 30 volts) near a lower end of an operating range for the battery, as part of supporting a wide input and/or output voltage level. The modulation scheme 900 may enable reduction of unequal switching common-mode noise at transformer 710 nodes. For example, the modulation scheme 900 may enable full zero voltage switching operation for higher power conversion efficiency. For example, the modulation scheme 900 may swap-out one of the two transformer windings to utilize the low battery voltage condition and still push high current to facilitate zero voltage switching. For example, the first secondary winding 711 may be swapped-out during the modulation state labeled "D1" (e.g., as shown in the time interval 932). For example, the second secondary winding 712 may be swapped-out during the modulation state labeled "D2" (e.g., as shown in the time interval 940). Each secondary winding of the transformer 710 may be swapped-out in every other cycle to help balance current among windings.

Figure 10:
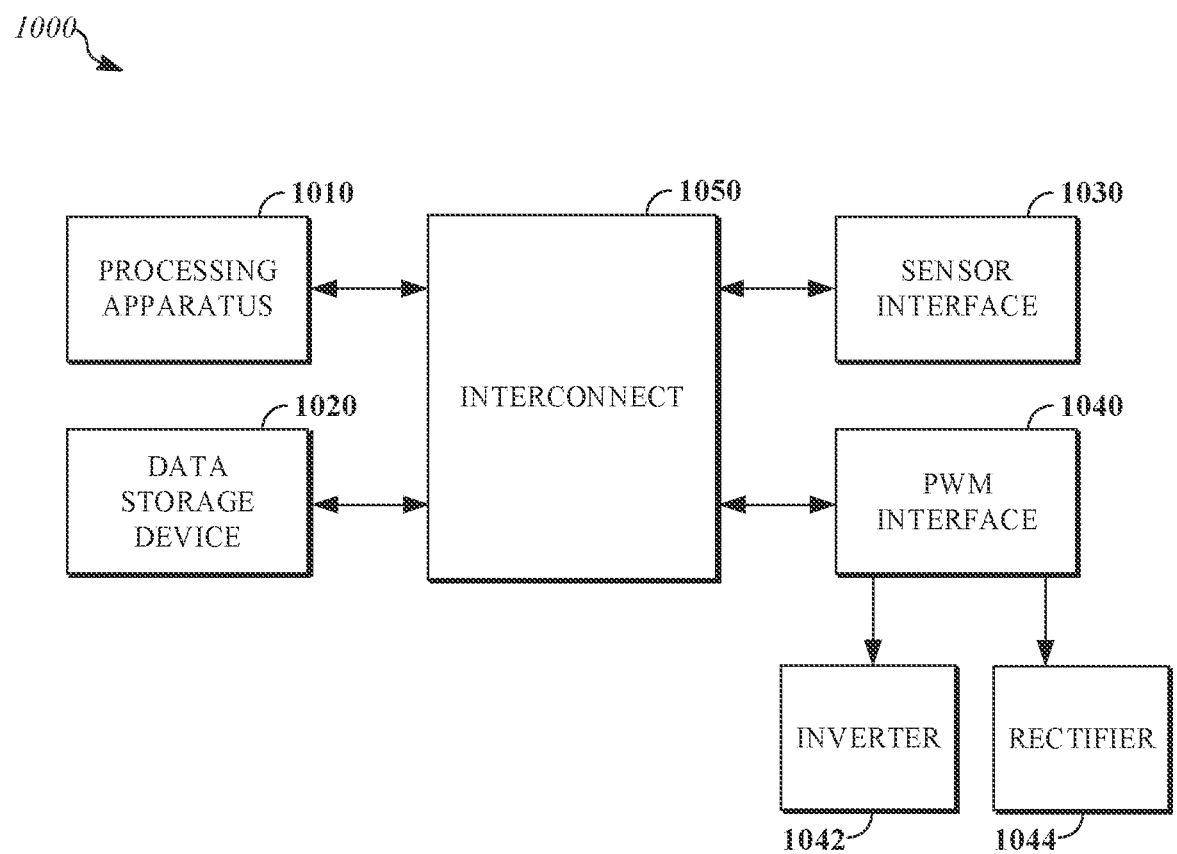
FIG. 10 is a block diagram of an example of a system for power conversion.

FIG. 10 is a block diagram of an example of a system 1000 for power conversion. The system 1000 may include a processing apparatus 1010, a data storage device 1020, a sensor interface 1030, a pulse width modulation interface 1040 to an inverter 1042 and a rectifier 1044, and an interconnect 1050 through which the processing apparatus 1010 may access the other components. The system 1000 may be configured to control a power converter (e.g., a DC/DC converter) including the inverter 1042 and/or the rectifier 1044. For example, the rectifier 1044 may include the rectifier of system 200 of FIG. 2. For example, the rectifier 1044 may include the rectifier of system 400 of FIG. 4. For example, the rectifier 1044 may include the rectifier of system 700 of FIG. 7.

The processing apparatus 1010 is operable to execute instructions that have been stored in a data storage device 1020. In some implementations, the processing apparatus 1010 is a processor with random access memory for temporarily storing instructions read from the data storage device 1020 while the instructions are being executed. The processing apparatus 1010 may include single or multiple processors each having single or multiple processing cores. Alternatively, the processing apparatus 1010 may include another type of device, or multiple devices, capable of manipulating or processing data. For example, the data storage device 1020 may be a non-volatile information storage device such as a hard drive, a solid-state drive, a read-only memory device (ROM), an optical disc, a magnetic disc, or any other suitable type of storage device such as a non-transitory computer readable memory. The data storage device 1020 may include another type of device, or multiple devices, capable of storing data for retrieval or processing by the processing apparatus 1010. For example, the data storage device 1020 can be distributed across multiple machines or devices such as network-based memory or memory in multiple machines performing operations that can be described herein as being performed using a single computing device for ease of explanation. The processing apparatus 1010 may access and manipulate data in stored in the data storage device 1020 via interconnect 1050. For example, the data storage device 1020 may store instructions executable by the processing apparatus 1010 that upon execution by the processing apparatus 1010 cause the processing apparatus 1010 to perform operations (e.g., operations that implement the modulation scheme 500 of FIG. 5, the modulation scheme 600 of FIG. 6, the modulation scheme 800 of FIG. 8, and/or the modulation scheme 900 of FIG. 9).

The sensor interface 1030 may be configured to control and/or receive data (e.g., voltage and/or current measurements for one or more windings of a transformer that magnetically couples the inverter 1042 to the rectifier 1044) from one or more sensors (e.g., a voltmeter or an ammeter). In some implementations, the sensor interface 1030 may implement a serial port protocol (e.g., I2C or SPI) for communications with one or more sensor devices over conductors. In some implementations, the sensor interface 1030 may include a wireless interface for communicating with one or more sensor groups via low-power, short-range communications (e.g., using a local area network protocol).

The pulse width modulation interface 1040 allows input and output of information to other systems to facilitate automated control of those systems. For example, the pulse width modulation interface 1040 may include latches, crystal oscillators, clocking circuits, and other logic circuits for generating control signals for switches in the inverter 1042 and the rectifier 1044. For example, the control signals may be binary pulse width modulated voltage signals. The pulse width modulation interface 1040 may generate control signals for switches in the inverter 1042 and the rectifier 1044 in response to one or more commands from the processing apparatus 1010. For example, the interconnect 1050 may be a system bus, or a wired or wireless network.

For example, the processing apparatus 1010 and/or the pulse width modulation interface 1040 may implement a pulse width modulation controller for a DC/DC power converter (e.g., the system 100 of FIG. 1A) including the inverter 1042 magnetically coupled to the rectifier 1044 via a transformer (e.g., the transformer 300 of FIG. 3A or the transformer 350 of FIG. 3B). The pulse width modulation controller may implement a modulation scheme (e.g., the modulation scheme 500 of FIG. 5, the modulation scheme 600 of FIG. 6, the modulation scheme 800 of FIG. 8, and/or the modulation scheme 900 of FIG. 9) and dynamically adjust control parameters of the modulation scheme. For example, the control parameters of the modulation scheme may include a duty cycle of the inverter 1042, a duty cycle of the rectifier 1044, a phase between control signaling for the inverter 1042 and control signaling for the rectifier 1044, and/or the switching frequency for the DC/DC power converter. The control parameters of the pulse width modulation controller may be adjusted based on operating parameters of the DC/DC power converter that are sensed (e.g., using sensors accessed via the sensor interface 1030). For example, the operating parameters may include an input DC voltage (e.g., voltage of the high voltage battery 102), an output DC voltage (e.g., voltage of the low voltage battery 104), and/or a current in DC/DC power converter (e.g., a current through a primary winding or a secondary winding of the transformer). For example, the pulse width modulation controller may implement a modulation scheme with zero voltage switching or zero current switching.

Figure 11:
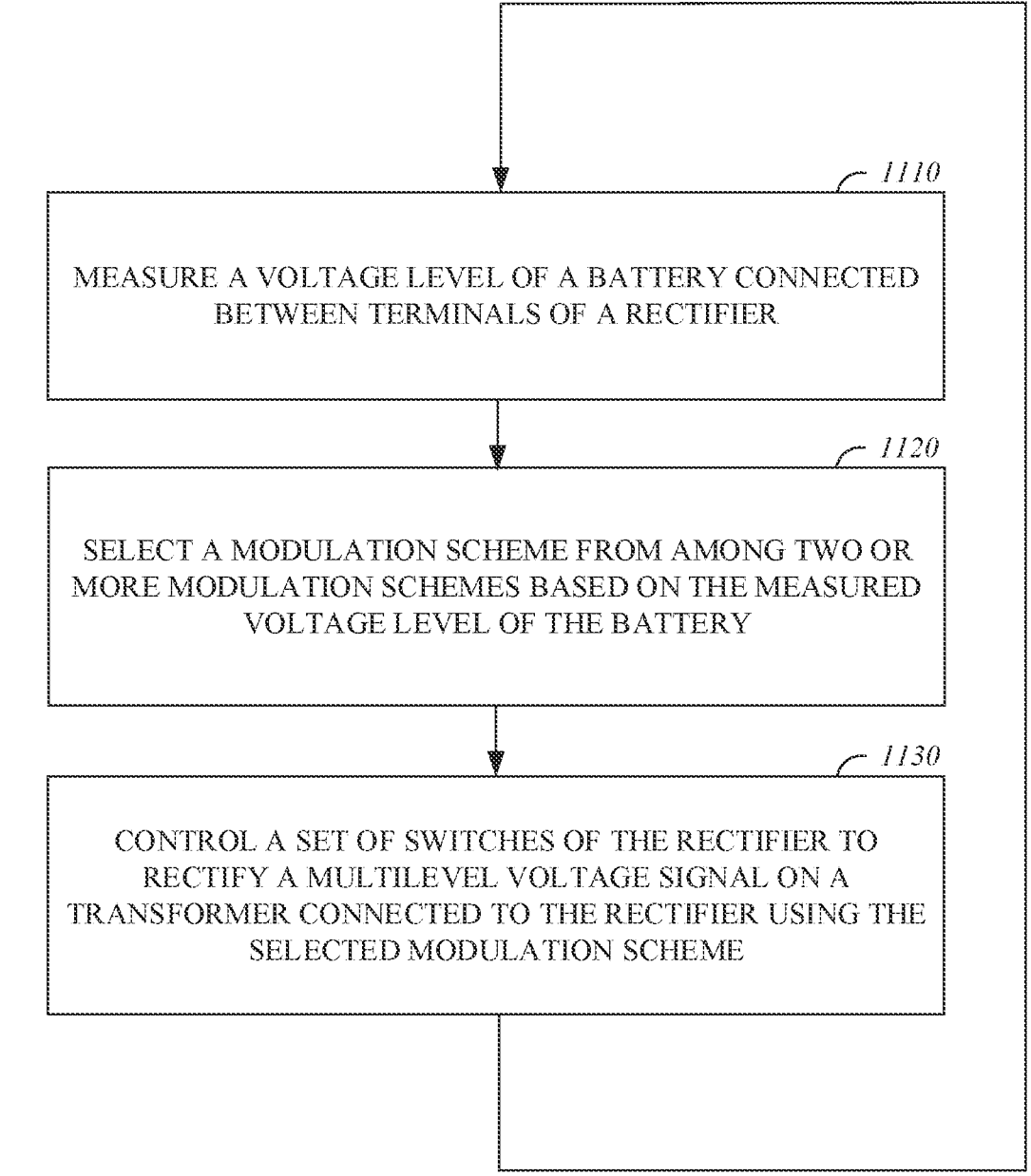
FIG. 11 is a flow chart of an example of a process for controlling switches of a rectifier for power conversion.

FIG. 11 is a flow chart of an example of a process 1100 for controlling switches of a rectifier for power conversion. The process 1100 includes measuring 1110 a voltage level of a battery connected between terminals of a rectifier; selecting 1120 a modulation scheme from among two or more modulation schemes based on a measured voltage level of the battery; and controlling 1130 a set of switches of the rectifier to rectify a multilevel voltage signal on a transformer connected to the rectifier using the selected modulation scheme. For example, the process 1100 may be implemented by the system 1000 of FIG. 10. For example, the process 1100 may be implemented to control switches in a multilevel synchronous rectifier and/or to control switches in a multilevel inverter. For example, the process 1100 may be implemented using the system 400 of FIG. 4. For example, the process 1100 may be implemented using the system 700 of FIG. 7.

The process 1100 includes measuring 1110 a voltage level of a battery (e.g., a low voltage battery) connected between terminals of a rectifier (e.g., the rectifier of the system 400 or the rectifier of the system 700). For example, a voltage sensor (e.g., a voltmeter) may be used to measure 1110 the voltage level of the battery. For example, the voltage level of the battery may vary as the battery is charged via the rectifier and/or discharged by auxiliary systems.

The process 1100 includes selecting 1120 a modulation scheme from among two or more modulation schemes based on a measured voltage level of the battery. In some implementations, a first modulation scheme of the two or more modulation schemes includes modulation states that individually utilize one at a time of a first secondary winding and a second secondary winding to conduct current through the battery, and a second modulation scheme of the two or more modulation schemes lacks modulation states that individually utilize one at a time of the first secondary winding and the second secondary winding to conduct current through the battery. For example, the modulation scheme 500 of FIG. 5 may be selected 1120 when the measured battery voltage is near a high end of an operating range of the battery (e.g., 60 volts) and the modulation scheme 600 of FIG. 6 may be selected 1120 when the measured battery voltage is near a low end of an operating range of the battery (e.g., 30 volts). For example, the modulation scheme 800 of FIG. 8 may be selected 1120 when the measured battery voltage is near a high end of an operating range of the battery (e.g., 60 volts) and the modulation scheme 900 of FIG. 9 may be selected 1120 when the measured battery voltage is near a low end of an operating range of the battery (e.g., 30 volts).

The process 1100 includes controlling 1130 a set of switches of the rectifier to rectify a multilevel voltage signal on a transformer connected to the rectifier using the selected modulation scheme. For example, process 1100 may be implemented with the system 400 and may include controlling 1130 the first switch 430, the second switch 432, the third switch 434, the fourth switch 436, and the fifth switch 438 to rectify a multilevel voltage signal on the transformer 410 using the selected modulation scheme (e.g., the modulation scheme 500 or the modulation scheme 600). For example, process 1100 may be implemented with the system 700 and may include controlling 1130 the first switch 730, the second switch 732, the third switch 734, the fourth switch 736, the fifth switch 737, and the sixth switch 738 to rectify a multilevel voltage signal on the transformer 710 using the selected modulation scheme (e.g., the modulation scheme 800 or the modulation scheme 900).

The process 1100 may be repeated periodically to detect and respond to state transitions of the battery voltage level (e.g., from a low voltage level to a high voltage level or from a high voltage level to a low voltage level) as they occur. For example, the process 1100 may be repeated once per minute, once per second, or once per millisecond.

A first implementation is a system that includes: a transformer including a first secondary winding, connecting a first tap and a second tap, and a second secondary winding, connecting a third tap and the second tap; a first capacitor connecting the first tap to a first node; a second capacitor connecting the third tap to a second node; a first switch connecting the first node to a first terminal; a second switch connecting the first node to the second node; a third switch connecting the second node to a second terminal; a fourth switch connecting the second tap to the first terminal; a fifth switch connecting the second tap to the second terminal; an electrical load connected between the first terminal and the second terminal; and a vehicle including a propulsion system configured to rotate wheels of the vehicle, a high voltage battery configured to provide power to the propulsion system, an inverter connected between the high voltage battery and a primary winding of the transformer, and a low voltage battery that is included in the electrical load.

A second implementation is a system that includes: a transformer including a first secondary winding, connecting a first tap and a second tap, and a second secondary winding, connecting a third tap and a fourth tap; a first switch connecting the first tap to a first terminal; a second switch connecting the first tap to the fourth tap; a third switch connecting the fourth tap to a second terminal; a fourth switch connecting the second tap to the first terminal; a fifth switch connecting the second tap to the third tap; a sixth switch connecting the third tap to the second terminal; an electrical load connected between the first terminal and the second terminal; and a vehicle including a propulsion system configured to rotate wheels of the vehicle, a high voltage battery configured to provide power to the propulsion system, an inverter connected between the high voltage battery and a primary winding of the transformer, and a low voltage battery that is included in the electrical load.

A third implementation is a system that includes: a transformer including a first secondary winding and a second secondary winding; a rectifier, including a set of switches, that connects taps of the first secondary winding and the second secondary winding to a first terminal and a second terminal, wherein the rectifier is symmetric with respect to the first secondary winding and the second secondary winding; a battery connected between the first terminal and the second terminal; a processing apparatus that is configured to control the set of switches to rectify a multilevel voltage signal on the transformer, including selecting a modulation scheme from among two or more modulation schemes based on a measured voltage level of the battery; and a vehicle including a propulsion system configured to rotate wheels of the vehicle, a high voltage battery configured to provide power to the propulsion system, an inverter connected between the high voltage battery and a primary winding of the transformer, and wherein the battery is a low voltage battery.

A fourth implementation is a system that includes: a transformer including a secondary winding connecting a first tap and a second tap; a first capacitor connecting the first tap to a first node; a second capacitor connecting the second tap to a second node; a first switch connecting the first node to a first terminal; a second switch connecting the first node to the second node; a third switch connecting the second node to a second terminal; and an electrical load connected between the first terminal and the second terminal.

What is claimed is:

1. A system comprising:
 a transformer including a first secondary winding and a second secondary winding;
 a rectifier, including a set of switches, that connects taps of the first secondary winding and the second secondary winding to a first terminal and a second terminal, wherein the rectifier is symmetric with respect to the first secondary winding and the second secondary winding;
 a battery connected between the first terminal and the second terminal; and
 a processing apparatus that is configured to control the set of switches to rectify a multilevel voltage signal on the transformer, including:
 selecting a modulation scheme from among two or more modulation schemes based on a measured voltage level of the battery, wherein each of the two or more modulation schemes is a periodic sequence of multiple modulation states with a period that corresponds to a whole number of periods of the multilevel voltage signal on the transformer, wherein a modulation state specifies which of the set of switches is in an on state, and wherein a first modulation scheme of the two or more modulation schemes includes at least one modulation state that is different than the modulation states of a second modulation scheme of the two or more modulation schemes.

2. The system of claim 1, wherein the first modulation scheme includes modulation states that individually utilize one at a time of the first secondary winding and the second secondary winding to conduct current through the battery, and the second modulation scheme lacks modulation states that individually utilize one at a time of the first secondary winding and the second secondary winding to conduct current through the battery.

3. The system of claim 1, wherein the rectifier comprises:
 a first capacitor connecting a first tap of the first secondary winding to a first node of the rectifier; and
 a second capacitor connecting a second tap of the second secondary winding to a second node of the rectifier.

4. The system of claim 1, wherein the set of switches includes a field effect transistor.

5. The system of claim 1, wherein the transformer includes a primary winding that is magnetically coupled to both the first secondary winding and the second secondary winding.

6. The system of claim 1, wherein the transformer includes a first primary winding and a second primary winding that are magnetically coupled respectively to the first secondary winding and the second secondary winding.

7. The system of claim 1 wherein the first modulation scheme simultaneously uses the first secondary winding and the second secondary winding, and the second modulation scheme alternately uses each of the first secondary winding and the second secondary winding.

8. The system of claim 7 wherein at least one of the first and second modulation schemes includes first and second modulation states corresponding to a same voltage level of the multilevel voltage signal on the transformer but activating different switches of the set of switches.

9. The system of claim 8 wherein the processing apparatus is configured to invoke each of the first and second modulation states during a single period of the multilevel voltage signal on the transformer.

10. The system of claim 8 wherein the processing apparatus is configured to change a phase of each of the first and second modulation states between periods of the multilevel voltage signal on the transformer.

11. The system of claim 1 wherein a first subset of the set of switches are switched identically in the first and second modulation schemes and wherein a second subset of the set of switches are switched differently in the first and second modulation schemes.

12. A method for power conversion, comprising:
measuring a voltage level of a battery connected between terminals of a rectifier that connects the battery to secondary windings of a transformer;
selecting a modulation scheme from among two or more modulation schemes based on the measured voltage level of the battery, wherein each of the two or more modulation schemes is a periodic sequence of multiple modulation states with a period that corresponds to a whole number of periods of a multilevel voltage signal on the transformer, wherein a modulation state specifies which of the plurality of switching devices is in an on state, and wherein a first modulation scheme of the two or more modulation schemes includes at least one modulation state that is different than the modulation states of a second modulation scheme of the two or more modulation schemes; and
controlling a set of switches of the rectifier to rectify the multilevel voltage signal on the transformer using the selected modulation scheme.

13. The method of claim 12, wherein the first modulation scheme includes modulation states that individually utilize one at a time of a first secondary winding of the transformer and a second secondary winding of the transformer to conduct current through the battery, and the second modulation scheme lacks modulation states that individually utilize one at a time of the first secondary winding and the second secondary winding to conduct current through the battery.

14. The method of claim 12 wherein at least one of the first and second modulation schemes includes first and second modulation states corresponding to a same voltage level of a multilevel voltage signal on the transformer but activating different switches of the set of switches.

15. The method of claim 14, comprising:
invoking each of the first and second modulation states during a single period of the multilevel voltage signal on the transformer.

16. The method of claim 14, comprising:
changing a phase of each of the first and second modulation states between periods of the multilevel voltage signal on the transformer.

17. The method of claim 12 wherein a first subset of the set of switches are switched identically in the first and second modulation schemes and wherein a second subset of the set of switches are switched differently in the first and second modulation schemes.

18. The method of claim 12 wherein at least one of the first and second modulation schemes is configured to communicate power bidirectionally between the transformer and the battery.

19. A system comprising:
a transformer including a secondary winding, connecting a first tap and a second tap;
a first capacitor connecting the first tap to a first node;
a second capacitor connecting the second tap to a second node;
a first switch connecting the first node to a first terminal;
a second switch connecting the first node to the second node;
a third switch connecting the second node to a second terminal; and
an electrical load connected between the first terminal and the second terminal.

20. The system of claim 19, wherein the first switch is a field effect transistor.

* * * * *